(12) United States Patent
Matsuno et al.

(10) Patent No.: US 7,943,534 B2
(45) Date of Patent: May 17, 2011

(54) SEMICONDUCTOR DEVICE MANUFACTURING METHOD AND SEMICONDUCTOR DEVICE MANUFACTURING SYSTEM

(75) Inventors: Akira Matsuno, Kanagawa (JP); Takashi Nire, Kanagawa (JP)

(73) Assignee: Phoeton Corp., Atsugi-shi (JP)

( * ) Notice: Subject to any disclaimer, the term of this patent is extended or adjusted under 35 U.S.C. 154(b) by 167 days.

(21) Appl. No.: 11/988,863

(22) PCT Filed: Jul. 24, 2006

(86) PCT No.: PCT/JP2006/314594
§ 371 (c)(1),
(2), (4) Date: Jan. 16, 2008

(87) PCT Pub. No.: WO2007/015388
PCT Pub. Date: Feb. 8, 2007

(65) Prior Publication Data
US 2009/0227121 A1  Sep. 10, 2009

(30) Foreign Application Priority Data
Aug. 3, 2005 (JP) ................................. 2005-226036

(51) Int. Cl.
*H01L 21/00* (2006.01)
(52) U.S. Cl. ........ 438/795; 438/166; 438/308; 438/487; 438/59; 257/344; 257/413; 257/408; 257/412
(58) Field of Classification Search .............. 438/795, 438/166, 308, 487, 59; 257/413, 344, 408, 257/412
See application file for complete search history.

(56) References Cited

U.S. PATENT DOCUMENTS

| 5,210,435 A * | 5/1993 | Roth et al. ............... 257/344 |
| 5,811,325 A * | 9/1998 | Lin et al. .................. 438/159 |
| 5,811,327 A * | 9/1998 | Funai et al. ............... 438/166 |
| 2004/0008980 A1 | 1/2004 | Morimoto et al. |
| 2004/0069751 A1 | 4/2004 | Yamazaki et al. |
| 2004/0171237 A1 | 9/2004 | Tanaka et al. |
| 2004/0241923 A1 | 12/2004 | Toida |
| 2004/0245583 A1 * | 12/2004 | Horiuchi et al. ............ 257/408 |
| 2004/0253838 A1 | 12/2004 | Yamazaki et al. |

FOREIGN PATENT DOCUMENTS

| EP | 1 432 022 A2 | 6/2004 |
| JP | A 06-077155 | 3/1994 |
| JP | A 2000-012484 | 1/2000 |
| JP | A 2003-059856 | 2/2003 |
| JP | A 2004-031557 | 1/2004 |
| JP | A 2004-128421 | 4/2004 |
| JP | A 2004-282060 | 10/2004 |
| JP | A 2004-304171 | 10/2004 |
| JP | A 2004-342954 | 12/2004 |
| JP | A 2004-349643 | 12/2004 |

* cited by examiner

*Primary Examiner* — Jarret J Stark
*Assistant Examiner* — Wilner Jean Baptiste
(74) *Attorney, Agent, or Firm* — Oliff & Berridge, PLC

(57) ABSTRACT

A semiconductor device manufacturing method and a semiconductor device manufacturing system for irradiating a first laser light (50) and a second laser light (52) with a wavelength different from that of the first laser light to a substrate (46) to perform a thermal processing on the substrate are provided. In the step for performing the thermal processing, at least one of an irradiation intensity and an irradiation time of a first laser and a second laser is controlled to control a temperature distribution in the substrate or a film on the substrate in a depth direction.

13 Claims, 18 Drawing Sheets

PENETRATION DEPTH: LONG

PENETRATION DEPTH: SHORT

ELECTRON CONCENTRATION
1  $1.4 \times 10^{16} cm^{-3}$
2  $2.8 \times 10^{16} cm^{-3}$
3  $1.7 \times 10^{17} cm^{-3}$
4  $3.2 \times 10^{17} cm^{-3}$
5  $6.1 \times 10^{18} cm^{-3}$
6  $1.0 \times 10^{18} cm^{-3}$ HOLE CONCENTRATION
1   $4.6 \times 10^{17} cm^{-3}$
2   $1.4 \times 10^{18} cm^{-3}$
3   $2.5 \times 10^{18} cm^{-3}$
4   $1.68 \times 10^{19} cm^{-3}$ POWER DENSITY OF FIRST LASER 217kW/cm²
POWER DENSITY OF SECOND LASER 33kW/cm²
MOVEMENT VELOCITY 1500mm/s POWER DENSITY OF FIRST LASER 167kW/cm²
POWER DENSITY OF SECOND LASER 100kW/cm²
MOVEMENT VELOCITY 1500mm/s POWER DENSITY OF FIRST LASER 50kW/cm²
POWER DENSITY OF SECOND LASER 233kW/cm²
MOVEMENT VELOCITY 1500mm/s

SEMICONDUCTOR DEVICE MANUFACTURING METHOD AND SEMICONDUCTOR DEVICE MANUFACTURING SYSTEM

TECHNICAL FIELD

The invention relates to a semiconductor device manufacturing method and a semiconductor device manufacturing system, and particularly to the manufacturing method and the manufacturing system of the semiconductor device for irradiating laser lights each having a different wavelength for performing a thermal processing.

BACKGROUND ART

In a process of manufacturing the semiconductor device, the substrate of the semiconductor is subjected to a thermal processing to a desired depth. For example, Patent Document 1 discloses a manufacturing method of an insulated gate bipolar transistor (IGBT). The aforementioned manufacturing method will be briefly described. The diffusion region such as a base region and an emitter region, the electrode such as the emitter electrode and the gate electrode, and the insulating film such as the gate insulating film and the inter-layer insulating film are formed on the surface of the conductive silicon substrate. The back surface of the substrate is ground to have the depth of 150 μm, for example. Then the diffusion region such as the field stop layer and the collector layer are formed on the back surface of the substrate through the ion implantation and the thermal processing to form the electrode such as the collector electrode.

Patent Documents 2, 3 and 4 disclose a semiconductor device manufacturing method or a laser annealing system for irradiating two types of laser lights each having a different wavelength to the silicon substrate or the silicon film, or the laser annealing system.

Patent Document 2 discloses a semiconductor device manufacturing method and a laser annealing system for irradiating the pulsed laser light with the wavelength of approximately 500 nm in the visible optical range, and the pulsed laser light with the wavelength of approximately 250 nm in the UV range to the amorphous silicon film, for example. This makes it possible to elongate the time period for maintaining the temperature of the amorphous silicon film constant.

Patent Documents 3 and 4 disclose a semiconductor device manufacturing method and a laser irradiation system for irradiating the continuous wave (CW) laser light with the wavelength of approximately 1 μm, and the CW laser light with the wavelength of approximately 500 nm to the amorphous silicon film, for example. This makes it possible to perform the uniform laser processing or to reduce the crystalline defective region formed on the semiconductor film by eliminating the uneven irradiation.

[Patent Document 1] Japanese Patent Application Publication No. 2003-59856
[Patent Document 2] Japanese Patent Application Publication No. 2000-12484
[Patent Document 3] Japanese Patent Application Publication No. 2004-128421
[Patent Document 4] Japanese Patent Application Publication No. 2004-282060

DISCLOSURE OF THE INVENTION

In the IGBT manufacturing method as disclosed in Patent Document 1, the ion implanted region on the back surface of the substrate is required to be heated to the temperature equal to or higher than the one sufficient to activate the ion. If the temperature of the substrate surface on which the diffusion region, electrode or the insulating film are formed becomes high, such phenomena as diffusion of the impurity on the diffusion region, reaction of metal which forms the electrode, thermal stress, or the reaction/hardening of the organic insulating film may occur. In the manufacturing process of the semiconductor device, it is necessary to heat the semiconductor device to the desired depth to the desired temperature.

It is an object of the invention to provide a semiconductor device manufacturing method and a semiconductor device manufacturing system capable of heating the substrate or the film thereon to the desired depth to the desired temperature.

In the invention, a semiconductor device manufacturing method includes a step of irradiating a first laser light and a second laser light with a wavelength different from that of the first laser light to a substrate to perform a thermal processing on the substrate or a film on the substrate. In the step for performing the thermal processing, at least one of an irradiation intensity and an irradiation time of the first and the second lasers is controlled so that a temperature distribution in the substrate or the film on the substrate in a depth direction is controlled. The invention provides the semiconductor device manufacturing method capable of heating the substrate or the film on the substrate to the desired depth to the desired temperature.

In the invention, a semiconductor device manufacturing method includes a step of irradiating a first laser light and a second laser light with a wavelength different from that of the first laser light to a substrate to perform a thermal processing on the substrate or a film on the substrate. A penetration depth of the first laser light to the substrate or the film on the substrate is twice a desired depth of thermal processing area of the substrate or the film on the substrate or less, and a penetration depth of the second laser light to the substrate or the film on the substrate is twice the desired depth of thermal processing area of the substrate or the film on the substrate or more. The invention provides the semiconductor device manufacturing method capable of heating the substrate or the film on the substrate to the desired depth to the desired temperature.

In the semiconductor device manufacturing method, the first and the second laser lights are irradiated to at least a portion of the substrate only for a predetermined time period. The invention allows the thermal processing to be performed in the temperature distribution before reaching thermal equilibrium state.

In the semiconductor device manufacturing method, the first laser light is a pulsed laser light or a continuous wave laser light, and the second laser light is the pulsed laser light or the continuous wave laser light. When the first laser light or the second laser light is the pulsed laser light, the irradiation time of the first laser light or the second laser light is controlled based on a pulse width of the pulsed laser light, and when the first laser light or the second laser light is the continuous wave laser light, the irradiation time of the first laser light or the second laser light is controlled based on a moving speed of the laser light on the substrate. The invention allows the thermal processing to be performed in the temperature distribution before reaching thermal equilibrium state.

In the semiconductor device manufacturing method, each of the first and the second laser lights is irradiated from a laser selected from a group including an excimer laser, a $CO_2$ laser, a YAG laser (fundamental wave or harmonic), a $YVO_4$ laser (fundamental wave or harmonic), a YLF laser (fundamental wave or harmonic), $YAlO_3$ laser (fundamental wave or harmonic), a glass laser (fundamental wave or harmonic), a ruby laser, an alexandrite laser (fundamental wave or harmonic), a Ti:sapphire laser (fundamental wave or harmonic), a helium-cadmium laser, a copper vapor laser, a gold vapor laser and a semiconductor laser.

In the invention, a semiconductor device manufacturing system includes a first laser for irradiating a first laser light, and a second laser for irradiating a second laser light with a wavelength different from that of the first laser light, in which the first and the second laser lights are irradiated to a substrate to perform a thermal processing on the substrate or a film on the substrate. In the system, a temperature distribution of the substrate or the film on the substrate in a depth direction is controlled by controlling at least one of an irradiation intensity and an irradiation time of the first and the second lasers. The invention provides the semiconductor device manufacturing system capable of heating the substrate or the film on the substrate to the desired depth to the desired temperature.

In the semiconductor device manufacturing method, at least one of the first and the second laser lights is a continuous wave laser light, and the irradiation time of the continuous wave laser light is controlled by adjusting a moving speed and a beam spot size in a moving direction of the continuous wave laser light on the substrate. The invention allows the user to select the time periods for irradiating two types of laser lights independently from the wide selection range. Accordingly, the depth and the temperature of the substrate or the film on the substrate allowed to be heated may be selected from the wide selection range.

In the invention, a semiconductor device manufacturing system includes a first laser for irradiating a first laser light, and a second laser for irradiating a second laser light with a wavelength different from that of the first laser light, in which the first and the second laser lights are irradiated to a substrate to perform a thermal processing on the substrate or a film on the substrate. In the system, a penetration depth of the first laser light to the substrate or the film on the substrate is twice a depth of a thermal processing area of the substrate or the film on the substrate or less, and a penetration depth of the second laser light to the substrate or the film on the substrate is twice the depth of the thermal processing area of the substrate or the film on the substrate or more. The invention provides the semiconductor device manufacturing system capable of heating the substrate or the film on the substrate to the desired depth to the desired temperature.

In the semiconductor device manufacturing system, the first and the second laser lights are irradiated to at least a portion of the substrate only for a predetermined time period. The invention allows the thermal processing to be performed in the temperature distribution before reaching thermal equilibrium state.

In the semiconductor device manufacturing system, the first laser is a pulsed laser or a continuous wave laser, and the second laser is the pulsed laser or the continuous wave laser. When the first laser or the second laser is the pulsed laser, the irradiation time of the first laser or the second laser is controlled based on a pulse width of the pulsed laser, and when the first laser or the second laser is the continuous wave laser, the irradiation time of the first laser light or the second laser light is controlled based on a moving speed of the laser light on the substrate. The invention allows the thermal processing to be performed in the temperature distribution before reaching thermal equilibrium state.

In the semiconductor device manufacturing system, each of the first and the second laser lights is irradiated from a laser selected from a group including an excimer laser, a $CO_2$ laser, a YAG laser (fundamental wave or harmonic), a $YVO_4$ laser (fundamental wave or harmonic), a YLF laser (fundamental wave or harmonic), $YAIO_3$ laser (fundamental wave or harmonic), a glass laser (fundamental wave or harmonic), a ruby laser, an alexandrite laser (fundamental wave or harmonic), a Ti:sapphire laser (fundamental wave or harmonic), a helium-cadmium laser, a copper vapor laser, a gold vapor laser and a semiconductor laser.

The invention is structured such that at least one of the first and the second lasers is a continuous wave laser, and the irradiation time of the continuous wave laser is controlled by adjusting a moving speed and a beam spot size in a moving direction of a laser light from the continuous wave laser on the substrate. The invention allows the user to select the time periods for irradiating two types of laser lights independently from the wide selection range. Accordingly, the depth and the temperature of the substrate or the film on the substrate allowed to be heated may be selected from the wide selection range.

As described above, the invention provides the semiconductor device manufacturing method and the semiconductor device manufacturing system capable of heating the substrate or the film thereon to the desired depth to the desired temperature.

BEST MODES FOR CARRYING OUT THE INVENTION

Figure 1:
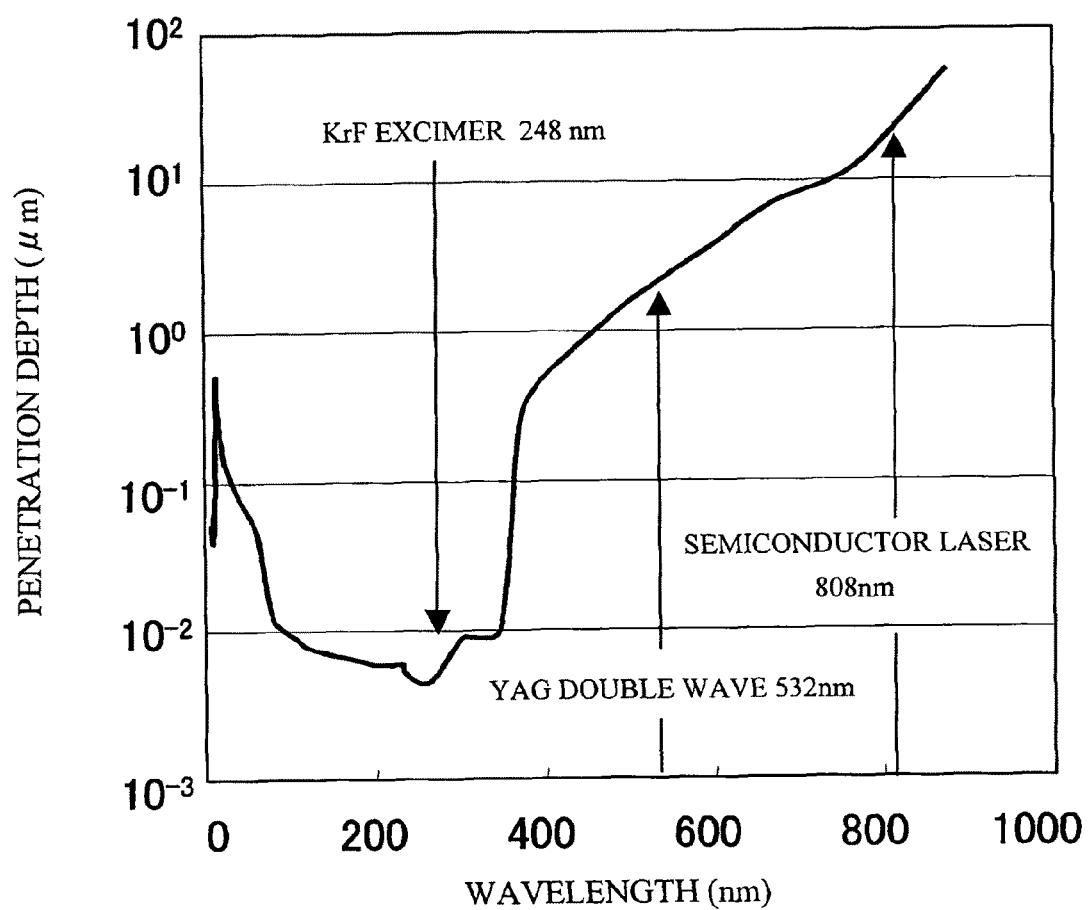
FIG. 1 is a view showing the wavelength dependence of the optical penetration depth to the silicon.

The principle of the invention will be described. FIG. 1 shows the optical penetration depth to the silicon with respect to the optical wavelength. The penetration depth denotes the distance to make the light intensity to 1/e. Referring to FIG. 1, the penetration depth is kept under 10 nm in the wavelength range from 100 nm to 350 nm. When the wavelength exceeds 370 nm, the penetration depth gradually increases accompanied with the increase in the wavelength to reach approximately 100 μm at the wavelength of 900 nm. For example, the optical penetration depth of the KrF excimer laser with the wavelength of 248 nm is 10 nm or less. The optical penetration depth of the second harmonic generation of YAG laser with the wavelength of 532 nm is approximately 2 μm. The optical penetration depth of the semiconductor laser light with the wavelength of 808 nm is approximately 20 nm.

Figure 2:
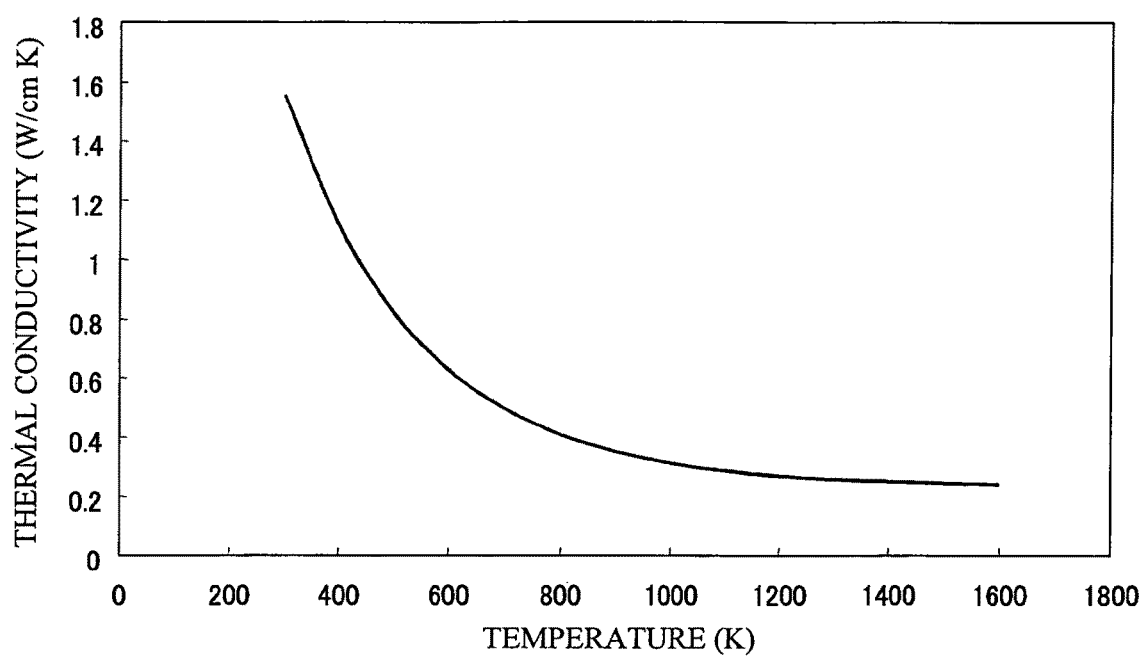
FIG. 2 is a view showing the temperature dependence of the thermal conductivity of the silicon.

FIG. 2 shows the thermal conductivity of the silicon with respect to the temperature. As the temperature increases, the thermal conductivity is reduced, which indicates that the heat propagation is deteriorated as the temperature becomes high.

Figure 3A:
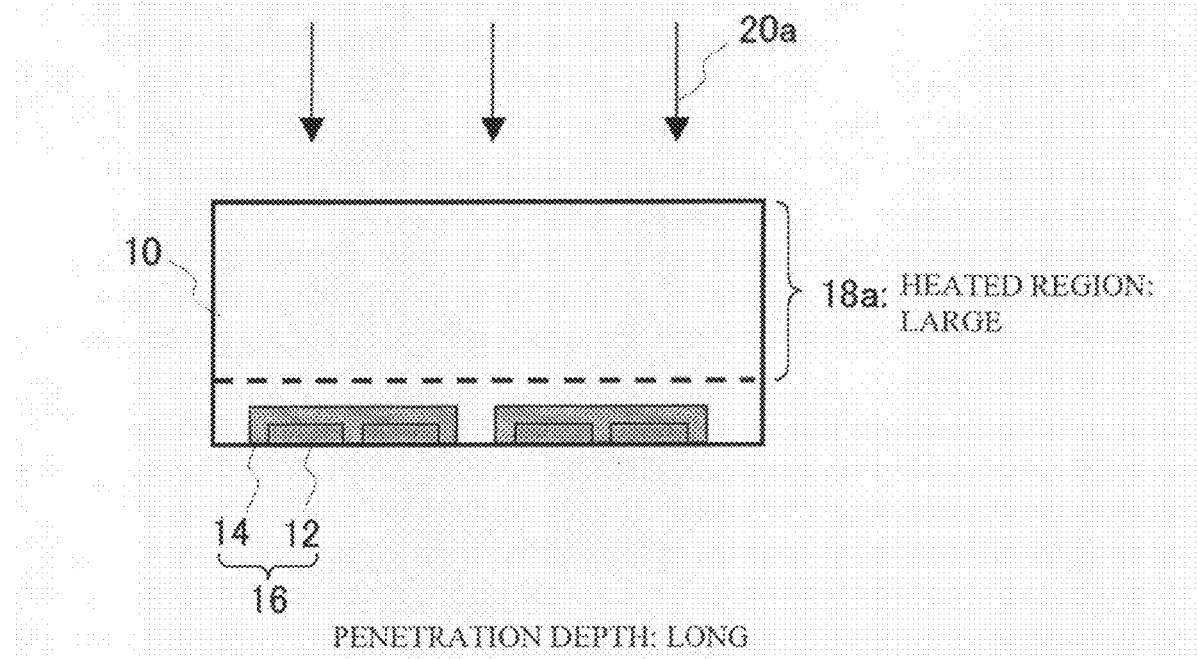
FIGS. 3(a) and 3(b) show heating ranges when the laser lights each with the different penetration depth are irradiated to the silicon substrates, respectively.
Figure 3B:
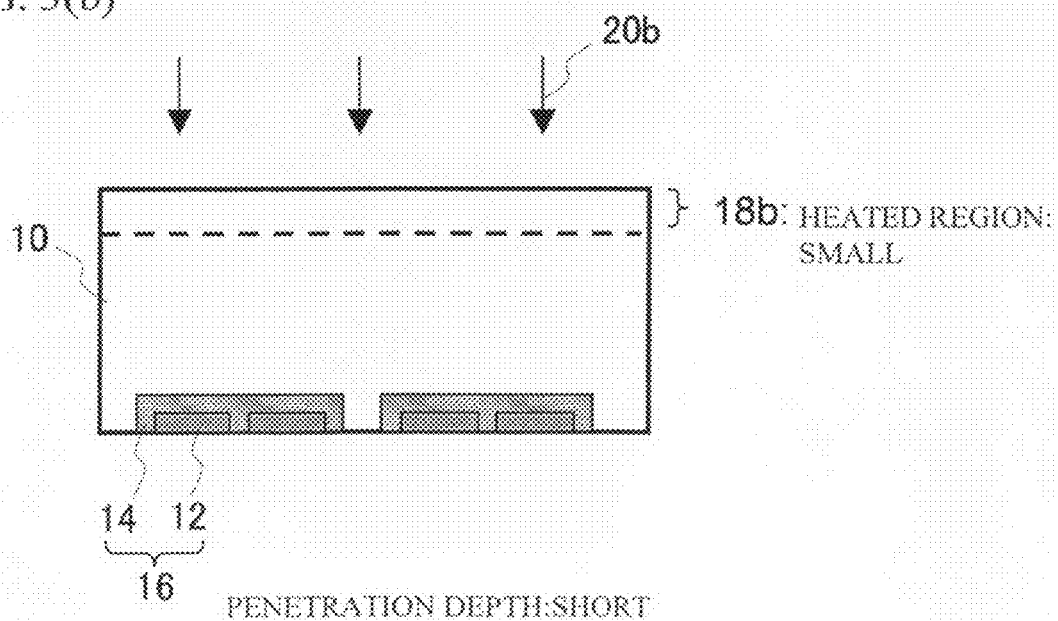

FIGS. 3(a) and 3(b) are schematic drawings of irradiation of the laser light to a silicon substrate 10, more specifically, irradiation of a laser light 20a with the long penetration depth and a laser light 20b with the short penetration depth, respectively. In each of the drawings, the lower side denotes the front surface of the silicon substrate 10, on which an operation layer 16 including an electrode 12 and a diffusion region 14 is formed. In the case where the laser light with the long penetration depth (for example, the semiconductor laser) is irradiated as shown in FIG. 3(a), the light may be absorbed into a wide range to make a heated region 18a of the silicon substrate 10 large. Meanwhile, in the case where the laser light with the short penetration depth (for example, second harmonic generation of YAG laser) is irradiated as shown in FIG. 3(b), the light may be absorbed around the surface (back surface of the silicon substrate) to make a heated region 18b small.

As the silicon substrate 10 is heated, the thermal conductivity is reduced as shown in FIG. 2, thus allowing efficient heating of the portion around the range where the light is absorbed.

The rate of light absorption which is the greatest around the surface will be decreased in the depth direction of the substrate exponentially. If the substrate is required to be heated from the back surface to the depth between the heating ranges 18a and 18b using the laser light 20a, the irradiation intensity of the laser or the irradiation time period has to be reduced for the purpose of maintaining the low temperature at the depth in the range 18a. If the aforementioned condition is set, the back surface of the substrate cannot be heated at sufficiently high temperature. The use of the laser light 20b increases the temperature of the portion deeper than the range 18b. So the laser irradiation intensity or the irradiation time period has to be increased. In the aforementioned case, the back surface of the substrate is excessively heated at the temperature higher than necessary, resulting in fusing on the back surface to leave the rough portion. It is, thus, difficult to heat the substrate to the desired depth to the desired temperature.

First Embodiment

In a first embodiment, a first laser light and a second laser light with the wavelength different from that of the first laser light are irradiated to the substrate for performing the thermal processing of the semiconductor substrate, for example.

Figure 4:
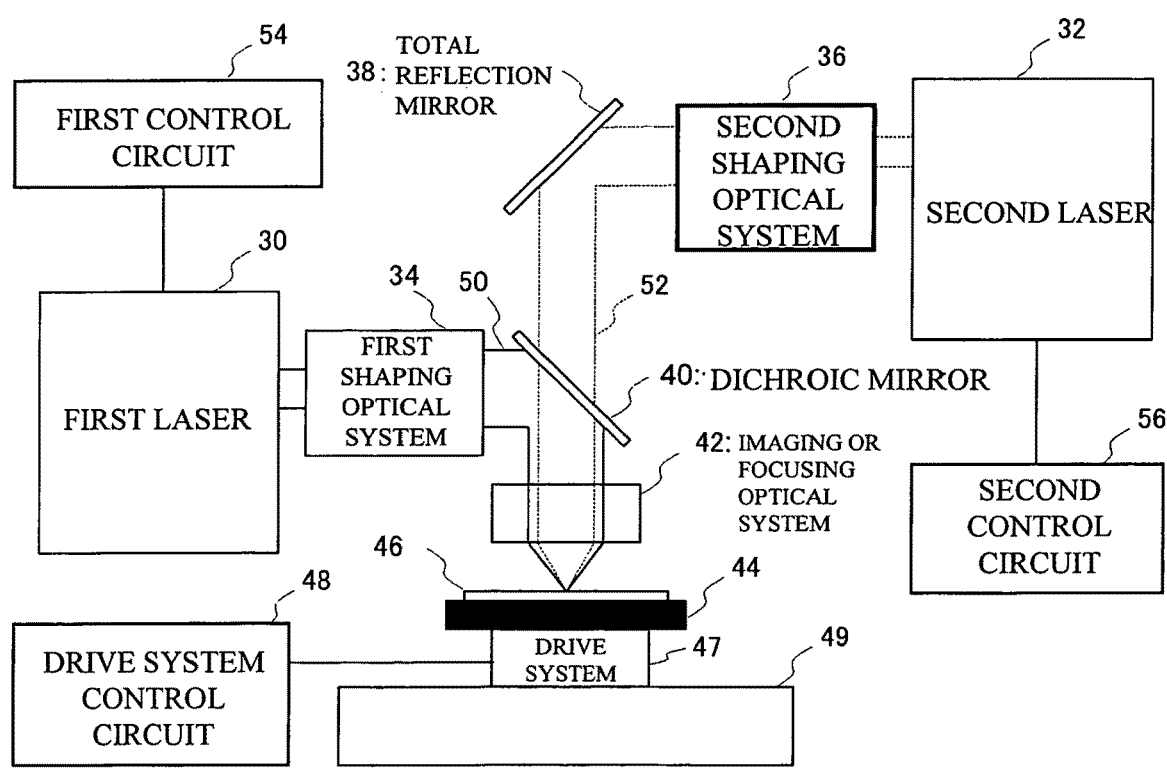
FIG. 4 is a view showing the structure of a laser annealing system according to a first embodiment.
Figure 5A:
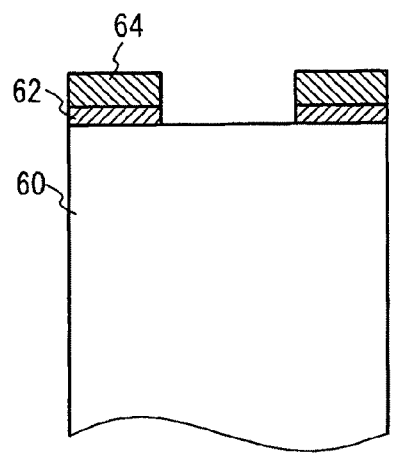
FIGS. 5(a) to 5(d) are cross sections each representing a semiconductor device manufacturing method according to a second embodiment (No. 1).
Figure 5B:
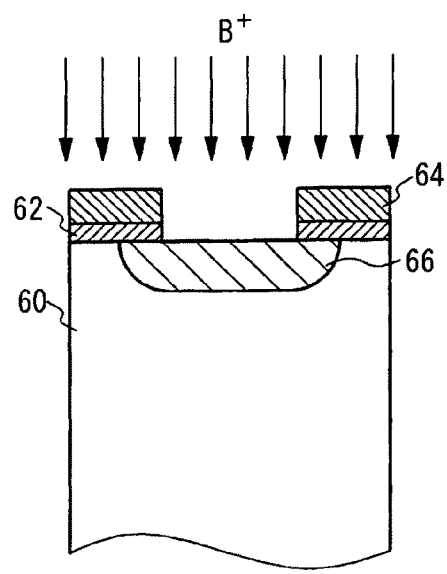
Figure 5C:
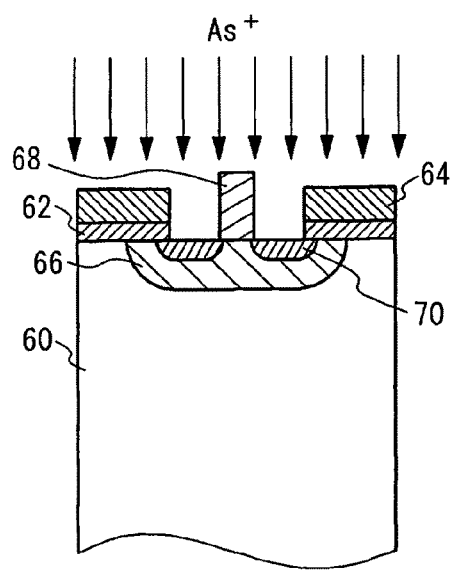
Figure 5D:
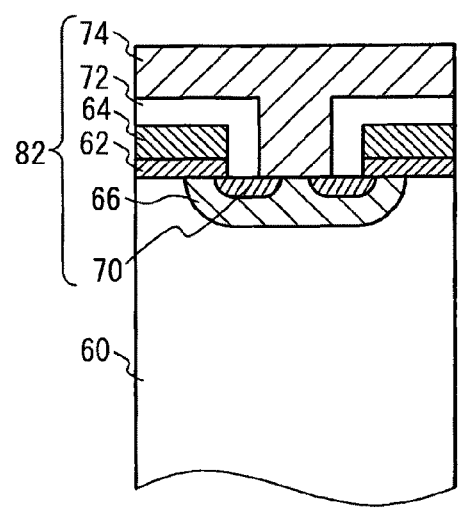
Figure 6A:
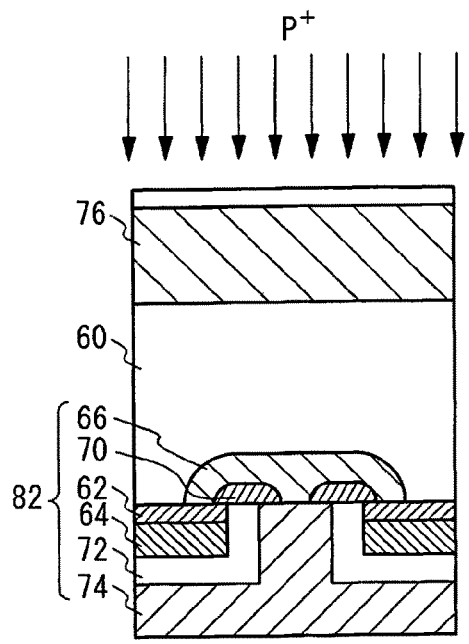
FIGS. 6(a) to 6(d) are cross sections each representing the semiconductor device manufacturing method according to the second embodiment (No. 2).
Figure 6B:
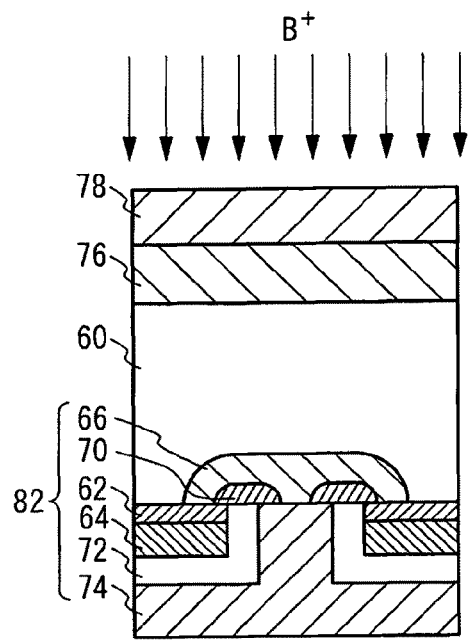
Figure 6C:
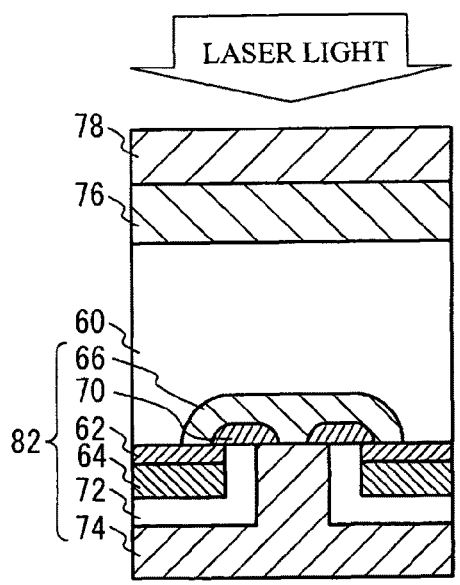
Figure 6D:
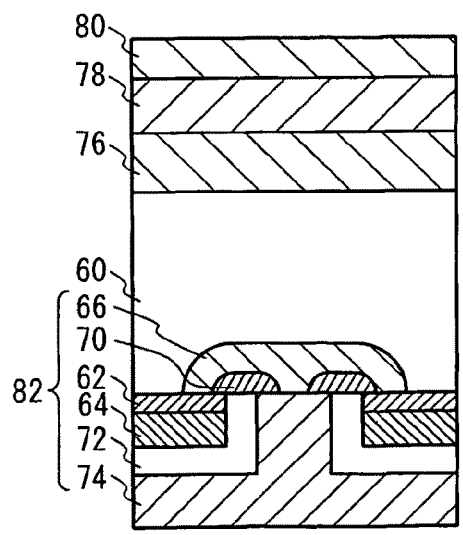

FIG. 4 is a conceptual view of a laser annealing system for irradiating two types of laser lights to the substrate. Referring to the drawing, the laser annealing system includes a first laser 30 for irradiating a first laser light 50, and a second laser 32 for irradiating a second laser light 52 with the wavelength different from that of the first laser light 50 such that the first and the second laser lights 50 and 52 are irradiated to a substrate 46 to perform the thermal processing.

The first laser light 50 emitted from the first laser 30 is shaped in a first shaping optical system 34, and is reflected by a dichroic mirror 40 to be focused on the substrate 46 by an imaging or focusing optical system 42. It is further irradiated to the substrate 46 as a subject to be annealed on a stage 44. Meanwhile, the second laser light 52 emitted from the second laser 32 is shaped in a second shaping optical system 36, and is reflected by a total reflection mirror 38 to pass through the dichroic mirror 40. It is focused on the substrate 46 by the imaging or focusing optical system 42.

The shaping optical systems 34 and 36 serve to widen the beam diameter or improve the beam profile, and to uniformize the light intensity. The dichroic mirror 40 reflects the first laser light 50, and passes the second laser light 52 to adjust optical axes of those laser lights 50 and 52. The imaging or focusing optical system 42 is a lens, serving to irradiate the laser lights 50 and 52 to a predetermined spot of the substrate 46. The optical axes of the first and the second laser lights 50 and 52 are adjusted so as to be irradiated to the same spot on the substrate 46.

A first control circuit 54 and a second control circuit 56 control the first laser 30 and the second laser 32 with respect to the laser irradiation timing, irradiation time period and irradiation intensity, respectively. The stage 44 is moved by a drive system 47 controlled by a drive system control circuit 48. This makes it possible to allow the first and the second laser lights 50 and 52 to be irradiated at any position of the substrate. The irradiation spot of the first and the second laser lights 50 and 52 on the substrate may be moved at a constant speed by moving the substrate 46 at the constant moving speed. The drive system 47 is mounted on a base 49.

With the above-structured laser annealing system, the first and the second laser lights 50 and 52 are simultaneously irradiated to the same spot on the substrate. The irradiation intensity values of the first laser light 50 and the second laser light 52 each having the different penetration depth to the substrate 46 may be controlled. The irradiation time periods of the first and the second laser lights 50 and 52 may also be controlled. This makes it possible to control the amount of light absorbed into the substrate 46 in the depth direction as well as the temperature distribution in the substrate 46 in the depth direction to which the laser light is irradiated. Accordingly, the substrate 46 may be heated to the desired depth to the desired temperature. The laser for irradiating the laser light with the penetration depth corresponding to various depth values for the thermal processing is not required. The same laser annealing system is available for the thermal processing of the substrate to various depths.

Second Embodiment

A second embodiment is an exemplary method for manufacturing the semiconductor device such as IGBT. FIGS. 5 and 6 are cross sections representing the manufacturing methods of the IGBT according to the first embodiment. In FIG. 5, the upper side denotes the upper surface of the substrate. In FIG. 6, the upper side denotes the back surface of the substrate.

Referring to FIG. 5(*a*), a gate insulation film 62 and a gate electrode 64 are formed on a conductive silicon substrate 60 with a generally employed photolithography. Referring to FIG. 5(*b*), a type P channel diffusion region 66 is formed by implanting boron (B) ions while having the gate electrode 64 serving as a mask for performing the thermal processing. Referring to FIG. 5(*c*), a photo resist 68 is formed, and an arsenic (As) is ion-implanted for the thermal processing to form a type n emitter diffusion region 70. Referring to FIG. 5(*d*), an insulating film 72 is formed through the generally employed CVD process and the photolithography. An emitter electrode 74 is further formed. Accordingly, an operation layer 82 is formed on the surface of the silicon substrate 60.

Referring to FIG. 6(*a*), the back surface of the silicon substrate 60 is ground to have the substrate thickness of 100 μm. Phosphorus (P) ion implantation is performed to the depth equivalent to that of the field stop layer 76 on the back surface of the substrate. Referring to FIG. 6(*b*), boron (B) ion implantation is performed to the depth equivalent to that of the collector diffusion region 78. The ion implanted field stop layer 76 has the depth of approximately 3 μm. The condition for performing the ion implantation is set such that the target depth of the field stop layer 76 becomes substantially the sum of the average projected range Rp and the projection standard deviation ΔRp of the ion implantation.

Referring to FIG. 6(*c*), the first and the second laser lights 50 and 52 are irradiated to the same region simultaneously to the back surface of the silicon substrate 60 for performing the thermal processing such that the diffusion region of the collector layer and the like is formed. The second harmonic generation of YAG laser (wavelength: 532 nm) may be used as the first laser light 50, and the semiconductor laser (wavelength: 808 nm) may be used as the second laser light 52. In this case, the second harmonic light generation optical system may be provided for the first laser 30 shown in FIG. 4. It is preferable to perform the thermal processing to at least the depth equivalent to that of the field stop layer 76 for activating the impurity ion of the field stop layer 76 and the collector diffusion region 78. Referring to FIG. 6(*d*), a collector electrode 80 is formed on the back surface of the substrate 60 to complete the formation of IGBT.

In the thermal processing explained referring to FIG. 6(*c*), the temperature of the area around the field stop layer 76 and the collector diffusion region 78 in the depth direction is required to be 1000° C. (1273 K) or higher for activating the ion implanted impurity. The temperature of the entire area around the silicon substrate 60 in the depth direction is required to be 1420° C. (1693 K) as the melting point of the silicon or lower. The temperature of the surface of the silicon substrate 60 is required to be 200° C. (473 K) or lower so as to prevent deterioration in the operation layer 82 formed on the surface under the thermal stress, for example.

The temperature distribution in the silicon substrate 60 in the thermal processing step is calculated by obtaining the value of the one-dimensional or two-dimensional heat conduction equation as formula 1 below.

$$\begin{cases} c\rho\dfrac{\partial T(x,t)}{\partial t} = \dfrac{\partial}{\partial x}\left[\kappa(T)\dfrac{\partial T(x,t)}{\partial x}\right] + \left[\dfrac{\partial}{\partial y}\left[\kappa(T)\dfrac{\partial T(x,t)}{\partial y}\right]\right] + \\ \alpha_1(1-R_1)I_1(x,(y),t) + \alpha_2(1-R_2)I_2(x,(y),t) \\ \dfrac{\partial T}{\partial x}\bigg|_{x=0} = 0 \\ T_{x=L} = T_0,\ T_{t=0} = T_0 \end{cases} \quad \text{Formula 1}$$

In the aforementioned formula 1, c denotes the specific heat of the silicon, ρ denotes the silicon density, T denotes the temperature, κ denotes the thermal conductivity of the silicon, $\alpha_1$ denotes the absorption coefficient of silicon with the wavelength of the first laser light, $\alpha_2$ denotes the absorption coefficient of silicon with the wavelength of the second laser light, $\lambda_1$ denotes the penetration depth of the first laser light to the silicon, $\lambda_2$ denotes the penetration depth of the second laser light to the silicon, $R_1$ denotes the reflection coefficient of the silicon at the wavelength of the first laser light, $R_2$ denotes the reflection coefficient of the silicon with the wavelength of the second laser light, $I_1$ denotes the laser power density of the first laser light, and $I_2$ denotes the laser power density of the second laser light. The respective values are employed as those shown in the Table 1.

TABLE 1

| | |
|---|---|
| c(J/gK) | 0.707 |
| ρ(g/cm$^3$) | 2.33 |
| κ(W/cmK) | 0.235 + 4.45exp(−T(K)/247) |
| $\alpha_1$(cm$^{-1}$)@532 nm | $1 \times 10^4$ |
| $\alpha_2$(cm$^{-1}$)@808 nm | $5.7 \times 10^2$ |
| $\lambda_1$(μm)@532 nm | 1 |
| $\lambda_2$(μm)@808 nm | 17.5 |
| $R_1$@532 nm | 0.38 |
| $R_2$@808 nm | 0.32 |

FIGS. 7, 8 and 9 show results of the calculation where the first laser light 50 is a triangle wave with the wavelength of 532 nm, the pulse width of 240 ns, and the rising time of 48 ns, and the second laser light 52 is a triangle wave with the wavelength of 808 nm, the pulse width of 240 ns, and the rising time of 48 ns, respectively. The temperature corresponding to the time elapsing from the time point of the laser light irradiation is shown with respect to the depth from the back surface of the silicon substrate 60, that is, the surface (back surface of the silicon substrate 60), 1 μm, 3 μm, 10 μm and 100 μm, respectively.

Referring to FIG. 7(*a*), the respective irradiation intensity (energy density) values of the first laser light 50 and the second laser light 52 are 1100 mJ/cm$^2$ and 0 mJ/cm$^2$. Referring to FIG. 7(*b*), the respective irradiation intensity values of the first and the second laser lights are 800 mJ/cm$^2$ and 1400 mJ/cm$^2$. Likewise, referring to FIG. 8(*a*), the respective irradiation intensity values of the first and the second laser lights are 600 mJ/cm$^2$ and 2800 mJ/cm$^2$. Referring to FIG. 8(*b*), the respective irradiation intensity values of the first and the second laser lights are 400 mJ/cm$^2$ and 3800 mJ/cm$^2$. Referring to FIG. 9(*a*), the respective irradiation intensity values of the first and the second laser lights are 200 mJ/cm$^2$ and 4800 mJ/cm$^2$. Referring to FIG. 9(*b*), the respective irradiation intensity values of the first and the second laser lights are 0 mJ/cm$^2$ and 6800 mJ/cm$^2$. The irradiation intensity of the respective lasers is set such that the temperature of the back surface of the silicon substrate 60 becomes approximately 1600 K so as not to exceed 1693 K as the melting point of the silicon.

The penetration depth of the first laser light 50 to the substrate 60 is set to the first penetration depth, and the penetration depth of the second laser light 52 to the substrate 60 is set to the second penetration depth.

The temperature of the substrate to the depth to 10 μm reaches the peak in the time range from 100 ns to 10 μs, and decreases due to thermal diffusion. Meanwhile, the temperature of the substrate to the depth of 100 μm does not increase immediately after irradiation of the laser light. However, the temperature increases in the time range from 10 μs to 100 μs due to the thermal diffusion, and is brought into substantially equilibrium state at 1 ms.

Figure 7A:
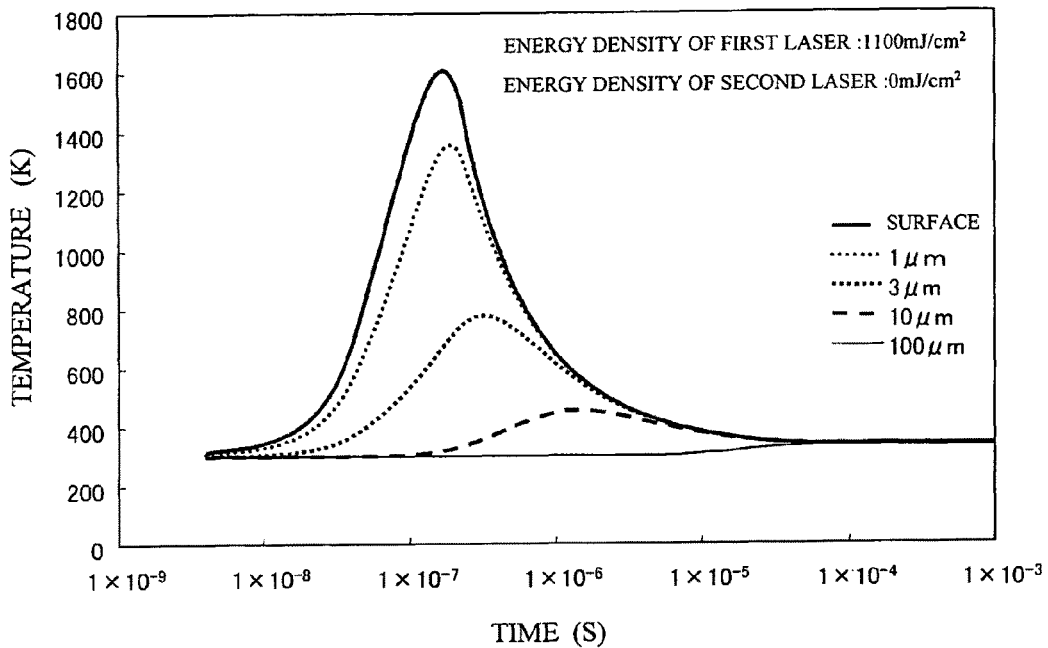
FIGS. 7(a) and 7(b) show temperatures of the silicon substrate in the depth direction when the first and the second laser lights are irradiated in the second embodiment (No. 1).
Figure 7B:
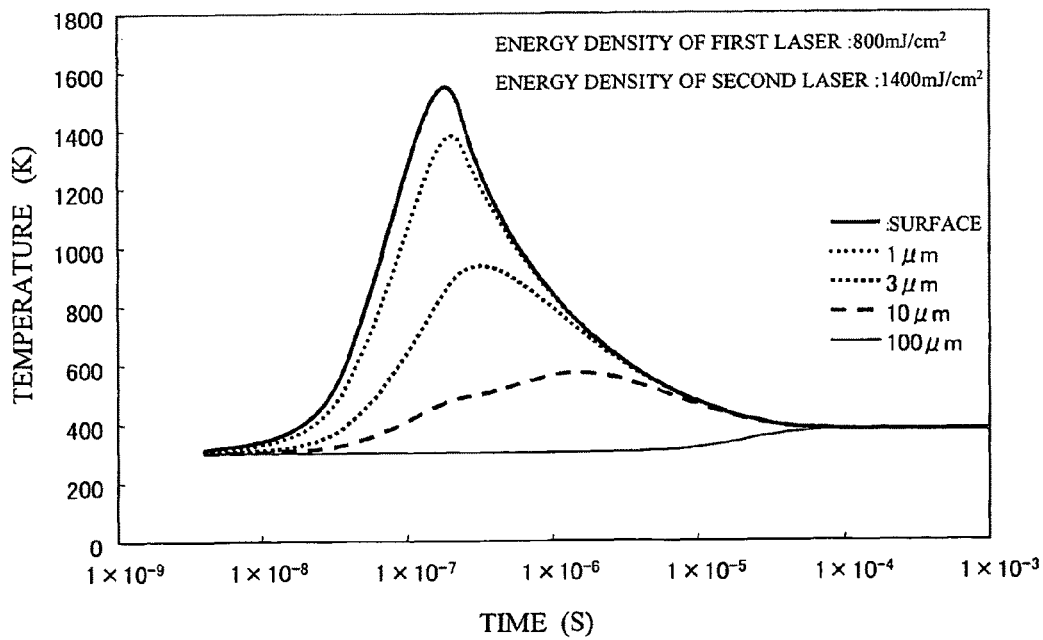
Figure 8A:
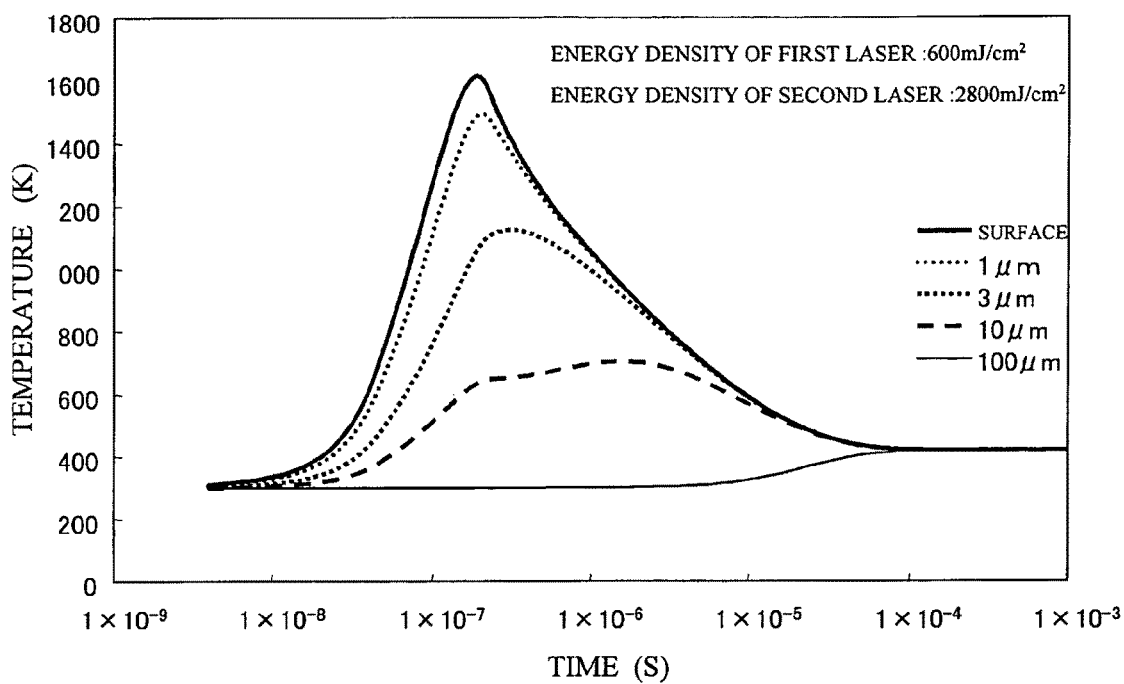
FIGS. 8(a) and 8(b) show temperatures of the silicon substrate in the depth direction when the first and the second laser lights are irradiated in the second embodiment (No. 2).
Figure 8B:
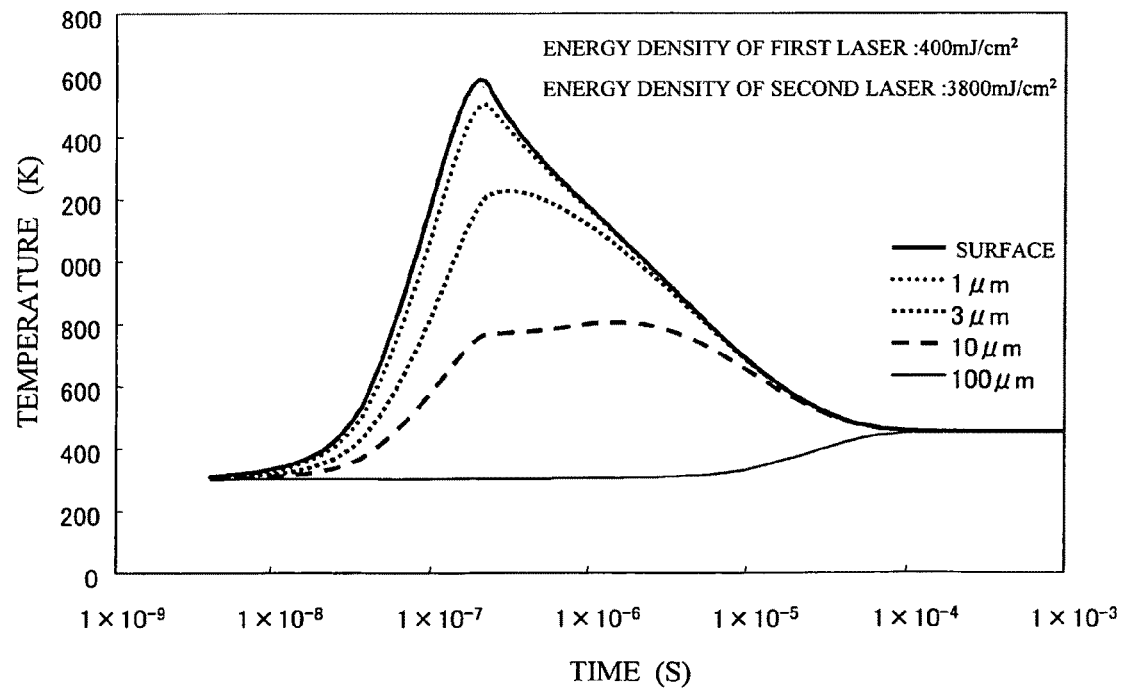

Referring to FIG. 7(a) showing the case where only the first laser light 50 is irradiated, the highest temperature in the region to the depth of 1 μm reaches 1300 K or higher, and the highest temperature in the region to the depth of 3 μm is 760 K. The highest temperature in the region to the depth of 1 μm has not reached 1273 K (1000° C.) required to activate the impurity because the penetration depth of the first laser light 50 to the silicon is approximately 1 μm, which is shorter than the depth equivalent to twice the penetration depth for the efficient heating, and shorter than the depth equivalent to the penetration depth for further efficient heating. It is difficult to activate the impurity implanted in the field stop layer 76 with the thickness of 3 μm to the entire area in the depth direction by irradiating only the first laser light 50.

Figure 9A:
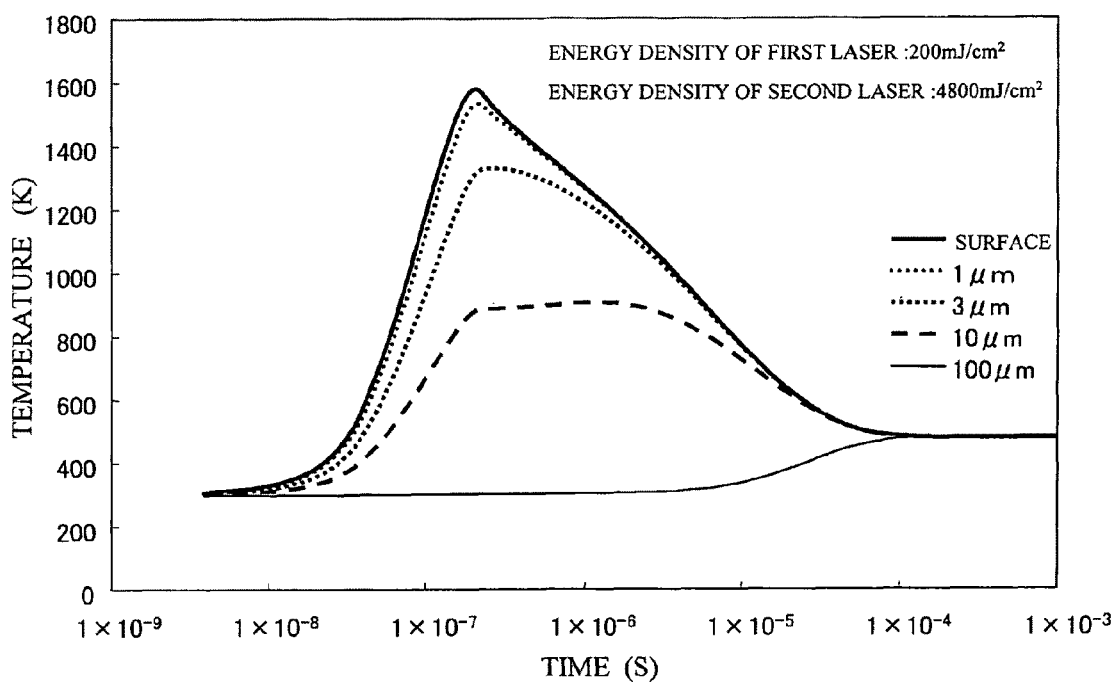
FIGS. 9(a) and 9(b) show temperatures of the silicon substrate in the depth direction when the first and the second laser lights are irradiated in the second embodiment (No. 3).
Figure 9B:
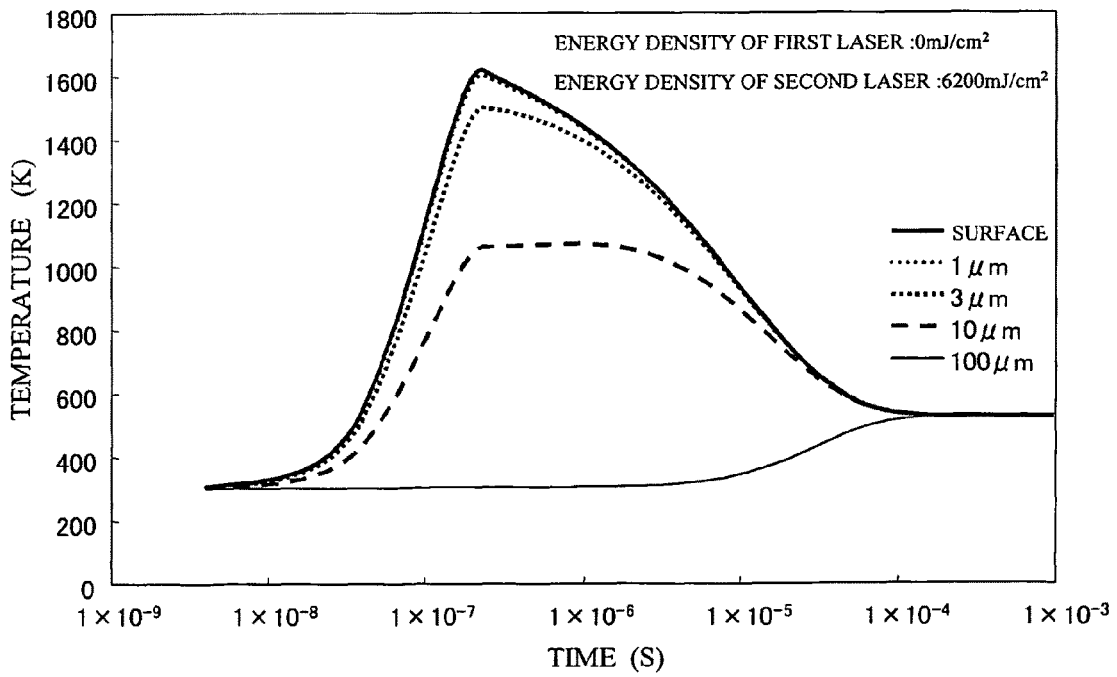

Referring to FIG. 9(b) showing the case where only the second laser light 52 is irradiated, the highest temperature in the region to the depth of 3 μm has reached 1500 K or higher. This makes it possible to activate the impurity implanted to the field stop layer 76 with the thickness of 3 μm over the entire area in the depth direction. However, the highest temperature of the substrate to the depth of 100 μm, that is, the surface of the silicon substrate becomes 520 K in excess of 473 K (200° C.) which may deteriorate the operation layer 82 on the surface of the silicon substrate 60. It is difficult for this case to activate the impurity implanted to the field stop layer 76 to the entire area in the depth direction without deteriorating the operation layer 82 on the surface of the silicon substrate 60.

Irradiation of only the first or the second laser light fails to satisfy the thermal processing conditions required for the IGBT manufacturing method according to the first embodiment as described above.

The temperatures at the respective depths of the substrate change as the increase in the irradiation intensity of the second laser light 52 as shown in the drawings in the order of FIGS. 7(a), 7(b), 8(a), 8(b), 9(a) and 9(b). Specifically, the respective temperatures of the substrate at the depth of 1 μm are 1350 K, 1380K, 1490 K, 1500 K, 1530 K, and 1580 K, which are not much different with one another. The respective temperatures of the substrate at the depth of 3 μm are 760 K, 930 K, 1120 K, 1210 K, 1320 K, and 1490 K, showing the upward trend. The respective temperatures of the substrate at the depth of 10 μm are 450 K, 560 K, 690 K, 800 K, 900 K, and 1060 K, also showing the upward trend. The respective temperatures of the substrate at the depth of 100 μm are 340 K, 370 K, 430 K, 440 K, 470 K, and 520 K showing the gentle upward trend.

In the second embodiment, the condition as represented in FIG. 9(a) (irradiation intensity of the first laser light 50 is set to 200 mJ/cm², irradiation intensity of the second laser light 52 is set to 3800 mJ/cm²) to bring the temperature of the entire area of the field stop layer 76 in the depth direction at the depth of 3 μm to 1273 K or higher, and the temperature of the area with the depth of 100 μm to 473 K or lower. This makes it possible to perform the thermal processing at the temperature or higher sufficient to activate the impurity which is ion implanted to the back surface of the substrate without deteriorating the operation layer formed on the substrate surface.

When the thermal processing is performed by using the laser annealing system described referring to FIG. 4, the respective irradiation intensities of the first and the second laser lights 50 and 52 are controlled so as to control the temperature distribution of the substrate 60 in the depth direction. This may provide the manufacturing method of the semiconductor device capable of heating the substrate or the film thereon to the desired depth to the desired temperature. The use of the laser annealing system for controlling the temperature distribution of the substrate 60 in the depth direction by controlling the irradiation intensities of the first and the second laser lights 50 and 52 provides the manufacturing system of the semiconductor device capable of heating the substrate or the film thereon to the desired depth to the desired temperature.

Referring to FIG. 7(a), the area of the substrate to the depth of 2 μm or less, that is, the depth twice the penetration depth may allow efficient heating, and the area to the depth equivalent to the penetration depth or less allows further efficient heating. The area to the depth up to 2 μm twice the first penetration depth of the first laser light 50 (more preferably, to the depth up to 1 μm equivalent to the first penetration depth) allows irradiation of only the first laser light 50 to sufficiently increase the temperature. However, the area to the depth in excess of 2 μm is unlikely to be heated to sufficiently increase the temperature. Referring to FIGS. 7(b) to 9(a), irradiation of the second laser light 52 with longer penetration depth is required for sufficiently heating the area to the depth in excess of 2 μm to increase the temperature. In other words, the temperature distribution in the area to the depth in excess of 2 μm may be controlled by irradiation of both the first and the second laser lights 50 and 52. It is preferable to set the depth of the thermal processing area to the value half the first penetration depth or more. That is, it is preferable to set the first penetration depth to be twice the depth of the thermal processing area or less. It is further preferable to set the first penetration depth to the depth of the thermal processing area or less as the area which allows further efficient heating is at the position equivalent to the penetration depth or less.

Referring to FIG. 7(a), in the case where only the first laser light 50 is irradiated, the highest temperature at the area to the depth in excess of 3 μm which is three times the first penetration depth of the first laser light 50 becomes lower than the highest temperature at the area to the depth up to approximately 1 μm when only the first laser light 50 is irradiated. This shows that it is not preferable to thermally process the area to the depth in excess of 3 μm by irradiating only the first laser light 50. Referring to FIGS. 7(b) to 9(a), in the case where the first and the second laser lights 50 and 52 are irradiated simultaneously, the rate of temperature rise resulting from irradiation of the second laser light 52 is increased at the area to the depth in excess of 3 μm compared with the area to the depth up to approximately 1 μm. In other words, the area to the depth in excess of 3 μm allows the temperature distribution control to be easily executed by irradiating the second laser light 52 compared with the area to the depth up to approximately 1 μm. It is preferable to set the depth of the thermal processing area to the value three times of the first penetration depth or more. That is, it is more preferable to set the first penetration depth to the value one third of the depth of the thermal processing area or less.

Referring to FIG. 9(b), in the case where only the second laser light 52 is irradiated, the highest temperature in the region to the depth of 10 μm which is half the second penetration depth is approximately 1000 K which has not reached the temperature (1273 K) sufficient for activating the impurity. Referring to FIGS. 7(b) to 9(a), the highest temperature in the region to the depth in excess of 10 μm is reduced as the energy density of the first laser light 50 becomes higher. It is preferable to set the depth of the thermal processing area to the value half the second penetration depth or less. In other words, preferably, the second penetration depth is twice the depth of the thermal processing area or more.

Referring to FIG. 9(b), the area to the depth of 3 μm which is one sixth of the second penetration depth allows efficient temperature increase by irradiation of only the second laser light 52. Accordingly, it is preferable to set the depth of the thermal processing area to the value one sixth of the second penetration depth or less. In other words, preferably, the second penetration depth is more than six times the depth of the thermal processing area.

Meanwhile, if the second penetration depth of the second laser light 52 exceeds the thickness of the silicon substrate, the surface of the silicon substrate 60 is heated upon irradiation of the second laser light 52, thus deteriorating the operation layer 82 on the surface of the silicon substrate 60. It is therefore preferable to set the second penetration depth of the second laser light 52 to the value equivalent to the thickness of the silicon substrate 60 or less.

In the case where the laser annealing system as described referring to FIG. 4 is employed for performing the thermal processing, preferably, the first penetration depth of the first laser light 50 to the substrate 60 is twice the depth of the thermal processing area of the substrate 60 or less, and the second penetration depth of the second laser light 52 to the substrate 60 is twice the depth of the thermal processing area of the substrate 60 or more. This makes it possible to provide the manufacturing method of the semiconductor device capable of heating the substrate or the film thereon to the desired depth to the desired temperature. Preferably, the first penetration depth of the first laser light 50 to the substrate 60 is equivalent to the depth of the thermal processing area of the substrate 60 or less, and the second penetration depth of the second laser light 52 to the substrate 60 is six times the depth of the thermal processing area of the substrate 60 or more, in other words, equivalent to the thickness of the substrate or less.

It is preferable to set the depth at the thermal processing area of the substrate to the depth of the field stop layer 76 (depth of ion implantation) for activating the entire area of the field stop layer 76 and the collector diffusion region 78, for example. Furthermore, it is preferable to set the depth to the sum of the average projected range Rp and the projected standard deviation ΔRp of the ion implantation in the field stop layer 76. Most of the ion implanted impurity distributes in the region to the depth equivalent to the sum of the ion implanted average projected range Rp and the projected standard deviation ΔRp of the ion implantation. The aforementioned region is thermally processed to activate the ion implanted impurity over the entire area of the field stop layer 76 and the collector diffusion region 78.

In the laser annealing system, the first penetration depth of the first laser light 50 to the substrate 60 is equal to or less than twice the depth at the thermal processing area of the substrate 60, and the second penetration depth of the second laser light 52 to the substrate 60 is equal to or more than twice the depth at the thermal processing area of the substrate 60. This makes it possible to provide the manufacturing system of the semiconductor device capable of heating the substrate or the film thereon to the desired depth to the desired temperature.

The irradiation of the first and the second laser lights 50 and 52 is considered for heating the area to the depth of approximately 3 μm from the surface of the silicon substrate.

Referring to FIG. 1, in the wavelength region, if the wavelength of the first laser light 50 is equal to or less than 370 nm, the penetration depth to the silicon is sharply reduced. Accordingly, annealing the region to the depth of approximately 1 μm or more is not practical. It is therefore preferable to set the wavelength of the first laser light 50 to 370 nm or more. It is more preferable to set the wavelength to 450 nm or more for making the penetration depth 1 μm or more.

Figure 10:
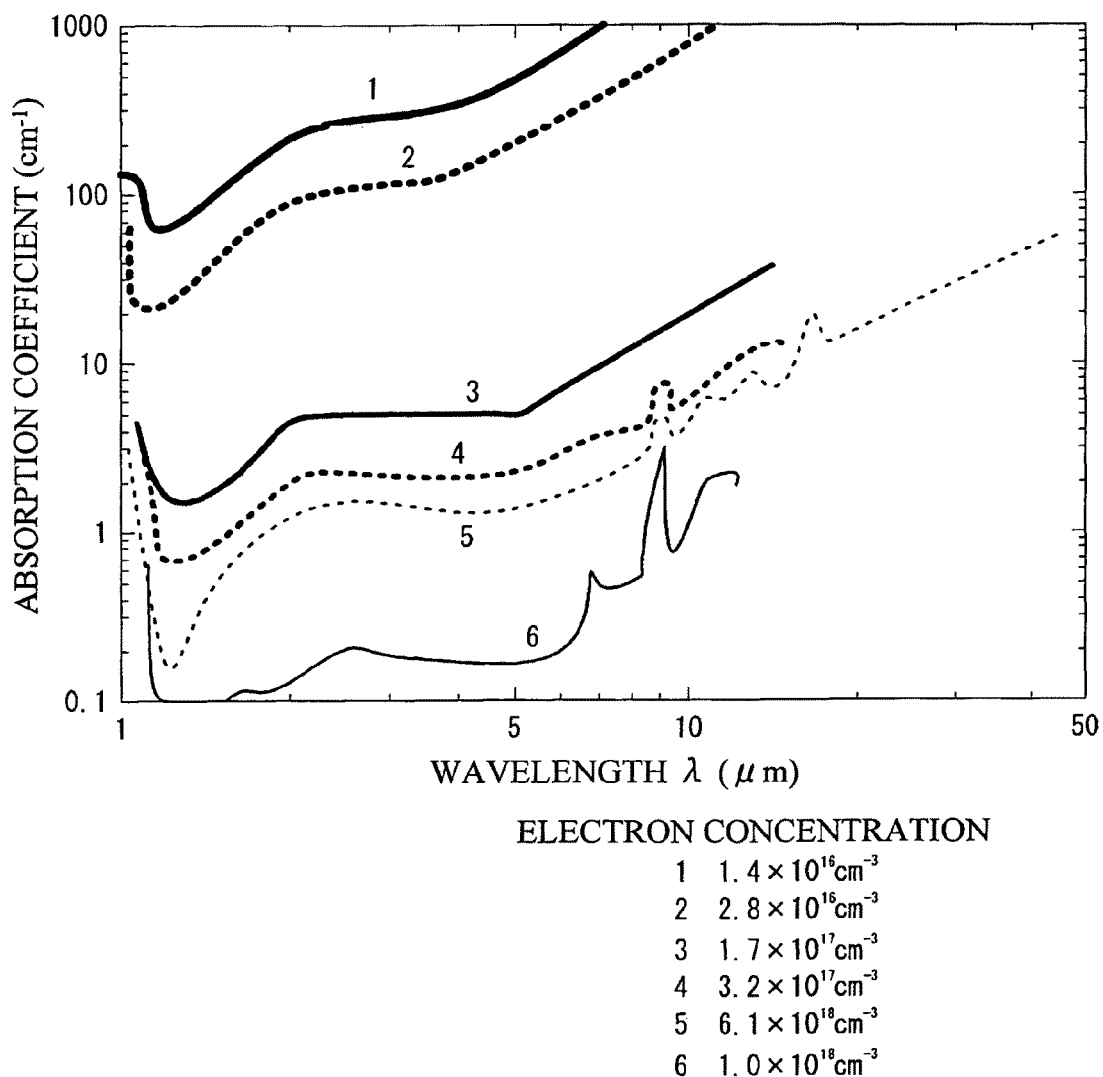
FIG. 10 is a view showing an absorption coefficient of the silicon with respect to the wavelength at the respective electron concentrations presented by Spitser et al. in Phys. Rev. 108, p. 268 (1957).
Figure 11:
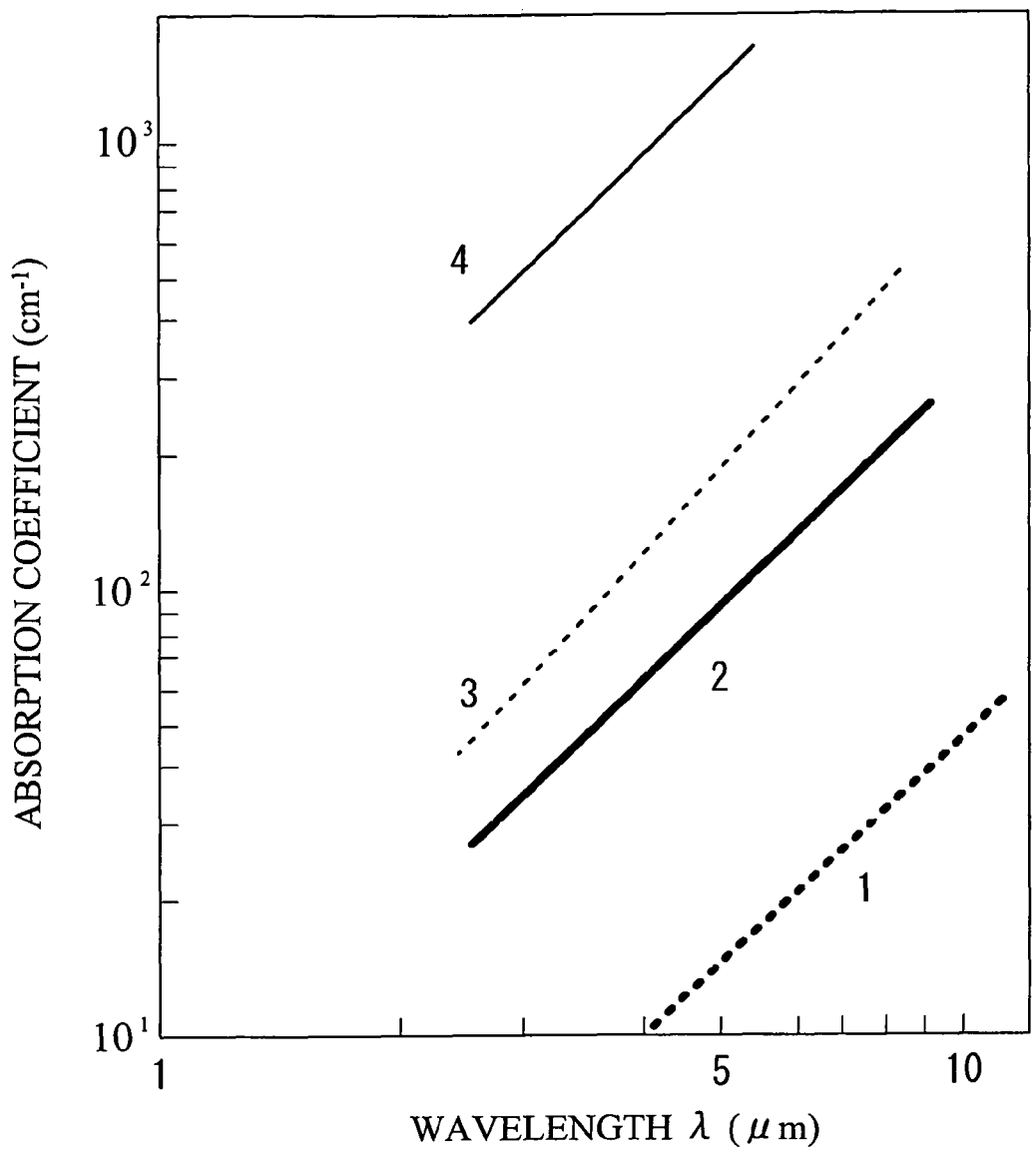
FIG. 11 is a view showing an absorption coefficient of the silicon to the wavelength at the respective hole concentrations presented by Hara et al. in J. Phys. Soc. Japan 21, p. 1222 (1966).

Generally, the thickness of the silicon substrate is set to be in the range from 100 μm to several hundreds μm. When the second penetration depth becomes 100 μm or more, the light absorbed into the substrate is reduced, thus failing to efficiently heating. It is therefore preferable to set the second penetration depth to 100 μm or less for avoiding the aforementioned problem. For this, preferably, the wavelength of the second laser light 52 is set to 900 nm or less, and more preferably, it is set to 850 nm or less such that the second penetration depth becomes 50 μm or less. Referring to FIGS. 10 and 11, the silicon absorbs the infrared light with the wavelength of approximately 10 μm. The penetration depth as the inverse of the absorption coefficient ($\alpha$) shown in the drawing becomes approximately 10 μm when the carrier density is $10^{19}$ cm$^{-3}$, and becomes approximately 50 μm when the carrier density is $10^{18}$ cm$^{-3}$. The laser with the oscillation wavelength in the aforementioned region may be used as the second laser. It is preferable to select the first and the second lasers in accordance with the penetration depth of each of the light with oscillation wavelength to the silicon rather than the oscillation wavelength.

The laser light with the short penetration depth is defined as the first laser light, and the laser light with the long penetration depth is defined as the second laser light. However, if the penetration depths of those laser lights are substantially the same, there is no difference in the thermal processing between the case where only the single laser light is used and the case where the two types of the laser lights are used. Preferably, the second penetration depth is twice the first penetration depth, and more preferably, more than five times longer than the first penetration depth.

In the second embodiment, the pulsed light is used as the first and the second laser lights such that the thermal processing may be performed with the temperature distribution formed before establishment of the thermal equilibrium state. It is preferable to irradiate the first and the second laser lights to at least a part of the substrate only for a predetermined period of time.

Third Embodiment

In a third embodiment, the continuous wave laser light is moved on the substrate to perform the thermal processing in the same manner as in the case using the pulsed light. FIG. 10 represents the temperature distribution in the silicon substrate where the irradiation spot on the silicon substrate is moved with the calculation method used in the second embodiment.

Figure 12A:
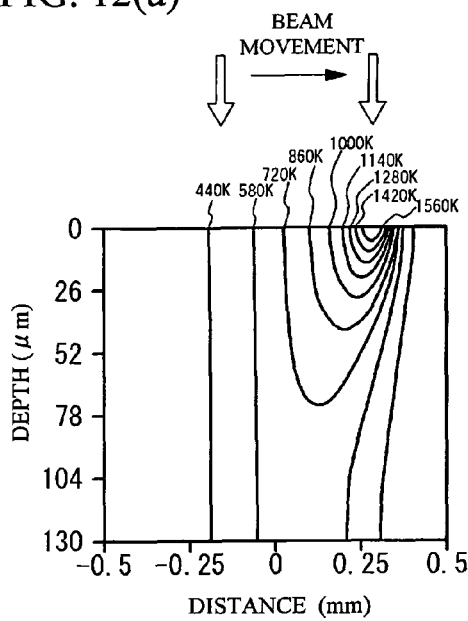
FIGS. 12(a) to 12(c) show temperatures of the silicon substrate in the depth direction when the first and the second laser lights are irradiated in a third embodiment.
Figure 12B:
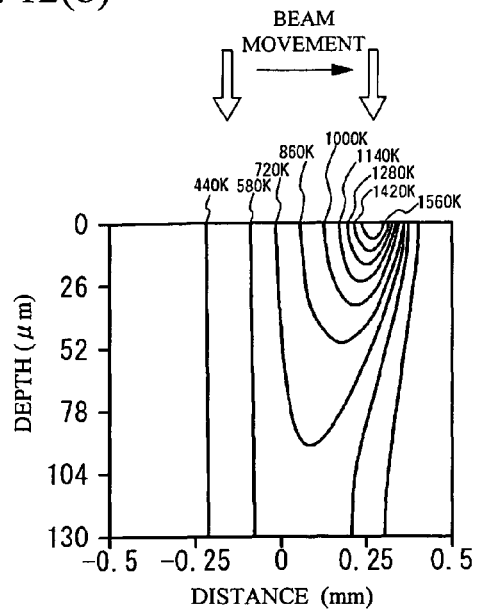
Figure 12C:
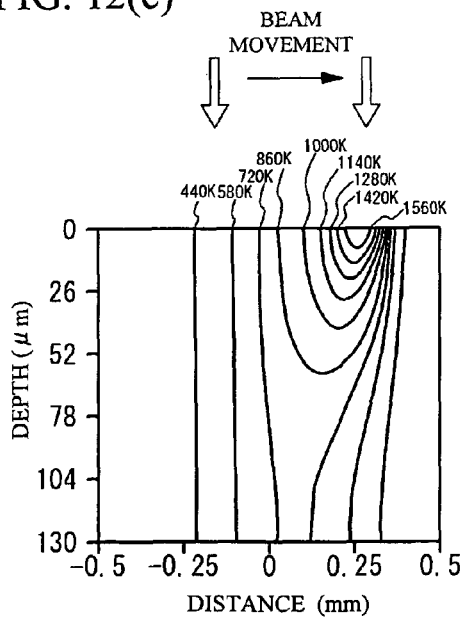

Each of FIGS. 12(a), 12(b) and 12(c) shows the temperature distribution inside the silicon substrate 60 when the irradiation spot of the first and the second laser lights are moved at 1500 mm/s. The laser lights are moved along the arrow indicating the beam movement as shown by the upper portion of the drawing. The power density of each of the first and the second laser lights 50 and 52 is set in reference to FIGS. 12(a), 12(b) and 12(c) such that the highest temperature of the substrate becomes approximately 1600° C. by increasing the power density of the second laser light 52.

The temperature at the spot on the substrate which receives irradiation of the laser lights is increased, and then sharply decreases after the irradiation. When the power density of the second laser light is increased, the depth at which the temperature exceeds 1280 K (approximately 1000° C.) is further deepened. As the spot on the substrate which receives irradiation of the first and the second laser lights is moved, each time period for irradiating the first and the second laser lights may be controlled likewise the case where the pulsed laser light with short pulse width is used. The thermal processing which is the same as the one using the pulsed light may be performed without using the pulsed laser with the short pulse width.

It is assumed that either the first or the second laser light is set to the pulsed laser light or the continuous wave laser light. If either the first or the second laser light is the pulsed laser light, the time for irradiating the first or the second laser light is controlled based on the pulse width. If either the first or the second laser light is the continuous wave laser light, the time for irradiating the first or the second laser light is controlled based on the speed of the laser light which moves on the substrate. The time for irradiating the continuous wave laser light may be controlled by adjusting the beam spot size (size of the laser light on the substrate surface) in the moving direction. If the beam spot size in the moving direction is large, the irradiation time may be elongated even if the moving speed is kept the same.

In the third embodiment, the time for irradiating the continuous wave laser light is controlled based on the moving speed of the continuous wave laser light on the substrate. Accordingly, the following advantages may be obtained. Firstly, when the laser is pulse oscillated, it is limited to have the pulse width inherent to the laser. In case of the YAG laser, it is difficult to generate the long pulse width because the relaxation time at the laser oscillation level of Nd:YAG is short at several tens ns. For example, the semiconductor laser performs the oscillation by the current drive. In this case, the power source has a limitation to generate the short pulse for the high current, and accordingly, it is difficult to oscillate the laser with the short pulse width for significant power. In the case where the pulsed light is used for controlling the time periods for irradiating two types of the laser light, the option of the irradiation time may be restricted owing to the limitation inherent to the laser. In the case where the time periods for irradiating the YAG laser and the semiconductor laser are controlled based on the pulse width, it is difficult to elongate the pulse width of the YAG laser and to shorten the pulse width of the semiconductor laser. The moving speed and the beam spot size in the moving direction of the continuous wave laser light on the substrate are adjusted respectively such that the respective irradiation time periods are independently controlled. This allows the user to select the time periods for irradiating the two types of the laser lights independently from the wider options. The depth and the temperature of the substrate or film thereon allowing the temperature rise may be selected from the wider options.

Secondly, the advanced technique and the complicated system are required for accurately synchronizing the pulse oscillation of two kinds of laser lights. In the case where the continuous wave laser is used, the aforementioned complicated system is not required.

Thirdly, in the case where the entire surface of the substrate is thermally processed with the pulsed light, if the interval between the beam spot of the pulsed light and the next pulsed light in the substrate is too large, the temperature of the area between the beam spots is reduced. The interval of the pulse oscillation and the overlapping rate of the beam spot are required to be considered for performing the thermal processing at the uniform temperature, which may deteriorate the throughput. Even if the interval and the beam spot are considered, it is difficult to completely eliminate the boundary between the beam spots, resulting in the uneven temperature. In the case where the continuous wave laser is used, the laser light is uniformly irradiated in the moving direction of the laser. Accordingly, there is no limitation as described above, thus providing the high throughput as well as improved evenness in the temperature.

If the continuous wave laser is used for at least one of the first and the second lasers, the aforementioned advantages may be obtained. In view of the even temperature, it is preferable to use the continuous wave lasers for both the first and the second lasers. If the continuous wave lasers are employed for the first and the second lasers, the respective moving speeds of the two laser lights are made the same. Each beam spot size of the respective laser lights is adjusted to allow independent control of the time periods for irradiating the respective laser lights. As for the scan of the laser light to the substrate, the substrate may be fixed and the laser light may be scanned across the substrate. Or the laser light may be fixed and the substrate may be moved under the laser light. Upon scanning of the laser light on the substrate, the laser light is moved in the reciprocating and orthogonal directions while reciprocating on the substrate to irradiate the laser lights over the entire substrate of the substrate. As the laser light is spirally irradiated from the center or periphery of the substrate to thermally process the entire surface of the substrate. In view of the throughput, it is preferable to irradiate the laser light spirally with less acceleration/deceleration.

Fourth Embodiment

In a fourth embodiment, the pulsed light is used as the first and the second laser lights while changing each period for irradiating the first and the second laser lights. FIGS. 11 to 14 show the temperatures in the substrate calculated using the same method as in the second embodiment. The irradiation time and the energy density of the first laser light 50 are kept constant, and the time for irradiating the second laser light 52 is changed. The irradiation intensity of the second laser light 52 is set such that the highest temperature in the silicon substrate becomes approximately 1600 K. The temperatures at the time point elapsing from the laser irradiation with respect to each depth of the silicon substrate 60 from its back surface, that is, the surface (back surface of the silicon substrate 60), 3 μm, 10 μm, and 100 μm are shown, respectively.

The irradiation time and the energy density of the first laser light 50 are 120 ns and 800 mJ/cm$^2$, respectively. Values of the irradiation time and the energy density of the second laser light 52 shown in FIGS. 13(a), 13(b), 14(a), 14(b), 15(a), 15(b), 16(a) and 16(b) are 60 ns and 500 mJ/cm$^2$, 120 ns and 600 mJ/cm$^2$, 180 ns and 800 mJ/m$^2$, 240 ns and 1000 mJ/cm$^2$, 300 ns and 1450 mJ/cm$^2$, 400 ns and 2300 mJ/cm$^2$, 500 ns and 3200 mJ/cm$^2$, and 600 ns and 4000 mJ/cm$^2$, respectively.

Figure 13A:
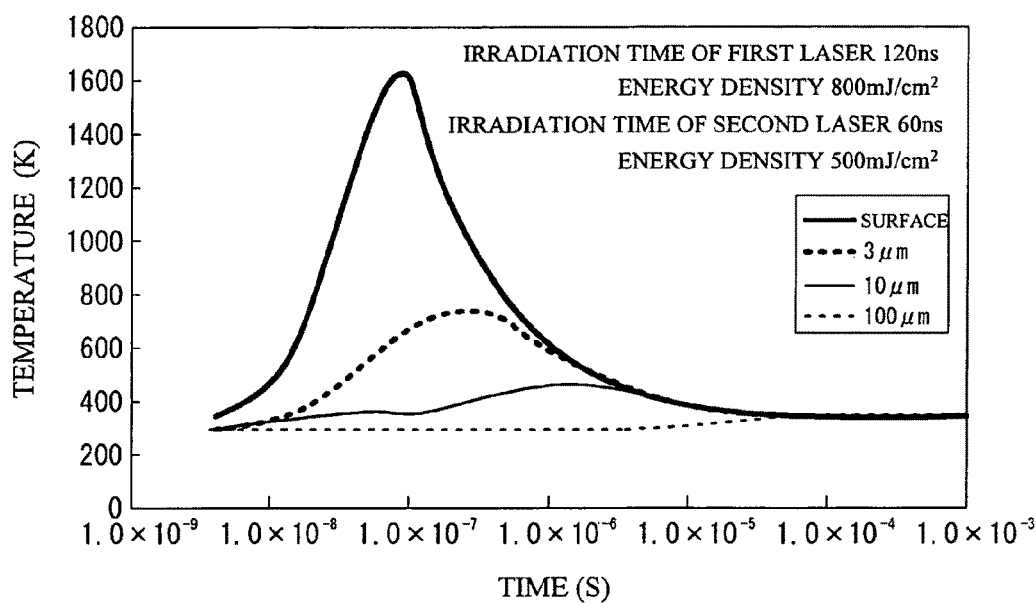
FIGS. 13(a) and 13(b) show temperatures of the silicon substrate in the depth direction when the first and the second laser lights are irradiated in a fourth embodiment (No. 1).
Figure 13B:
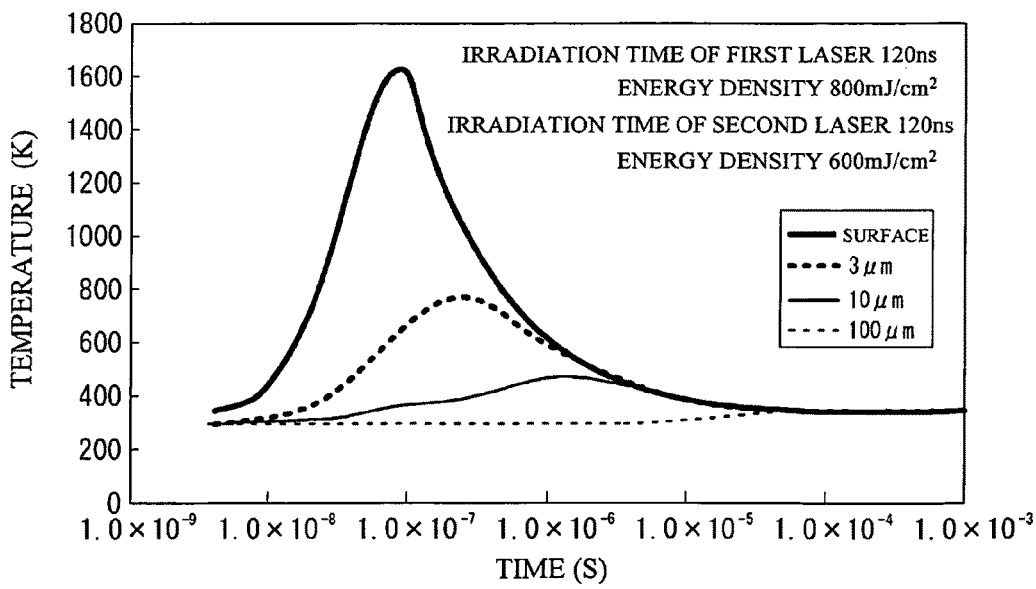
Figure 14A:
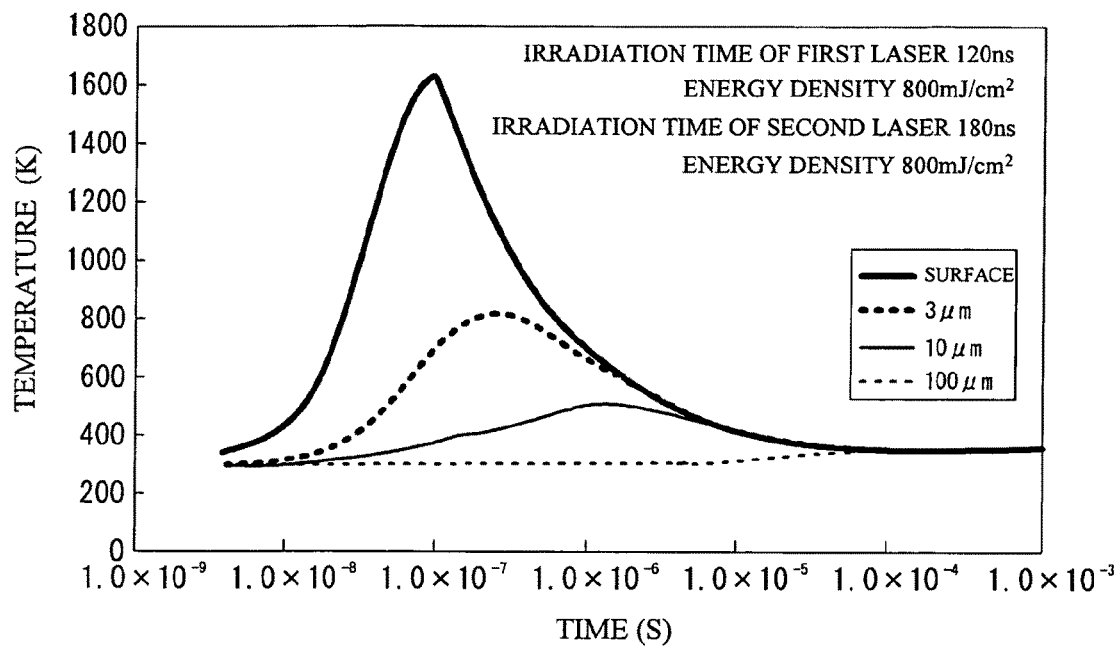
FIGS. 14(a) and 14(b) show temperatures of the silicon substrate in the depth direction when the first and the second laser lights are irradiated in the fourth embodiment (No. 2).
Figure 14B:
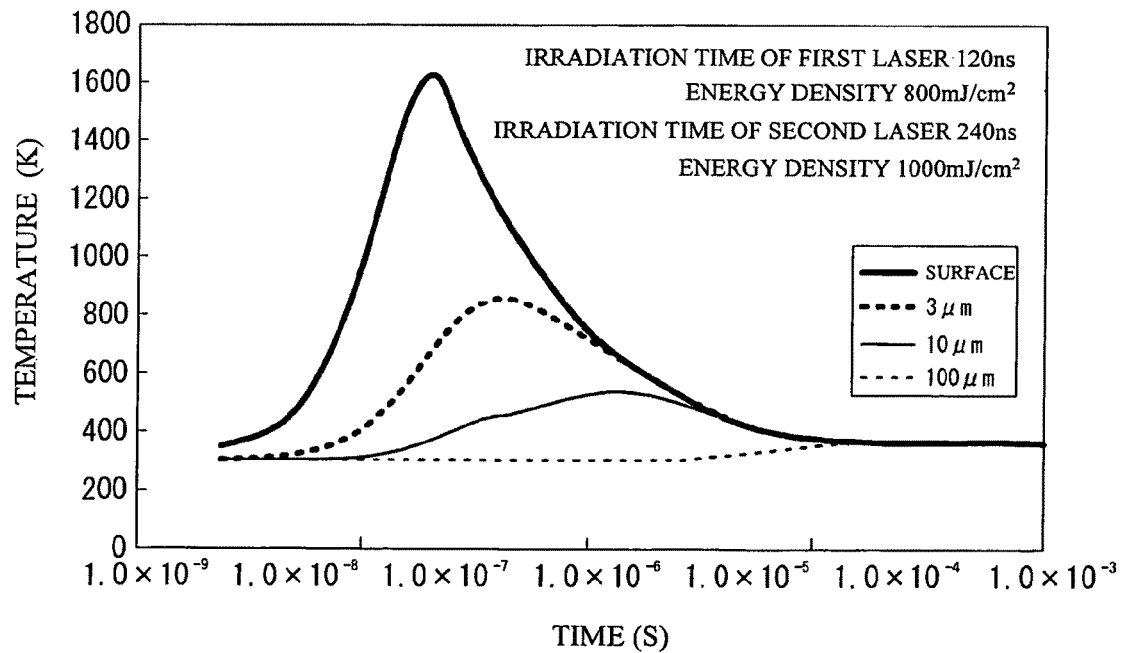
Figure 15A:
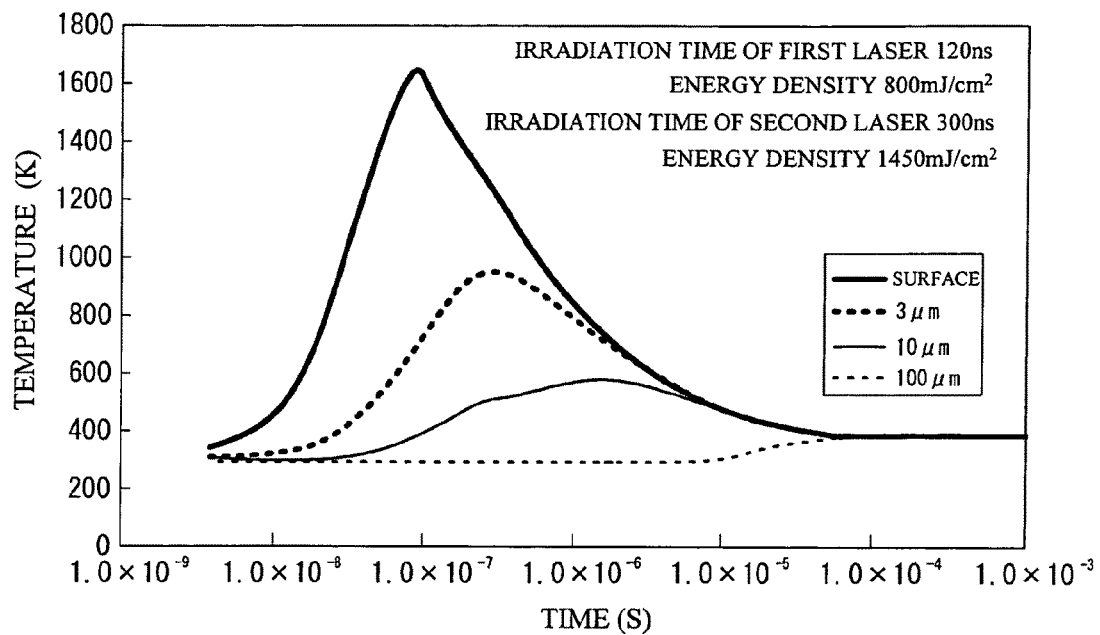
FIGS. 15(a) and 15(b) show temperatures of the silicon substrate in the depth direction when the first and the second laser lights each having different energy density are irradiated in the fourth embodiment (No. 3).
Figure 15B:
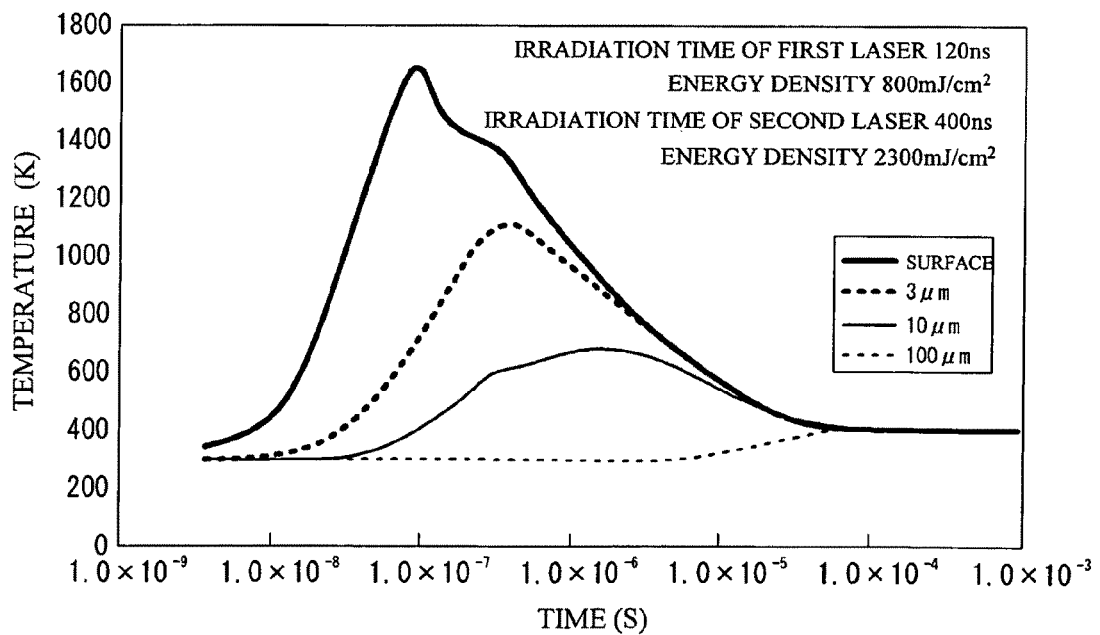
Figure 16A:
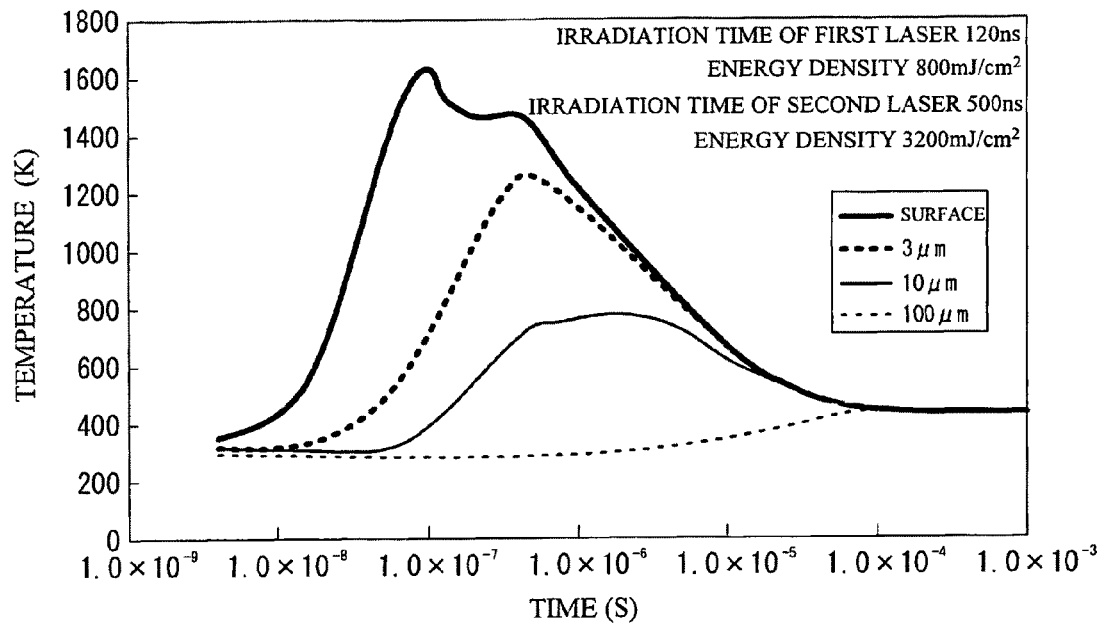
FIGS. 16(a) and 16(b) show temperatures of the silicon substrate in the depth direction when the first and the second laser lights are irradiated in the fourth embodiment (No. 4).
Figure 16B:
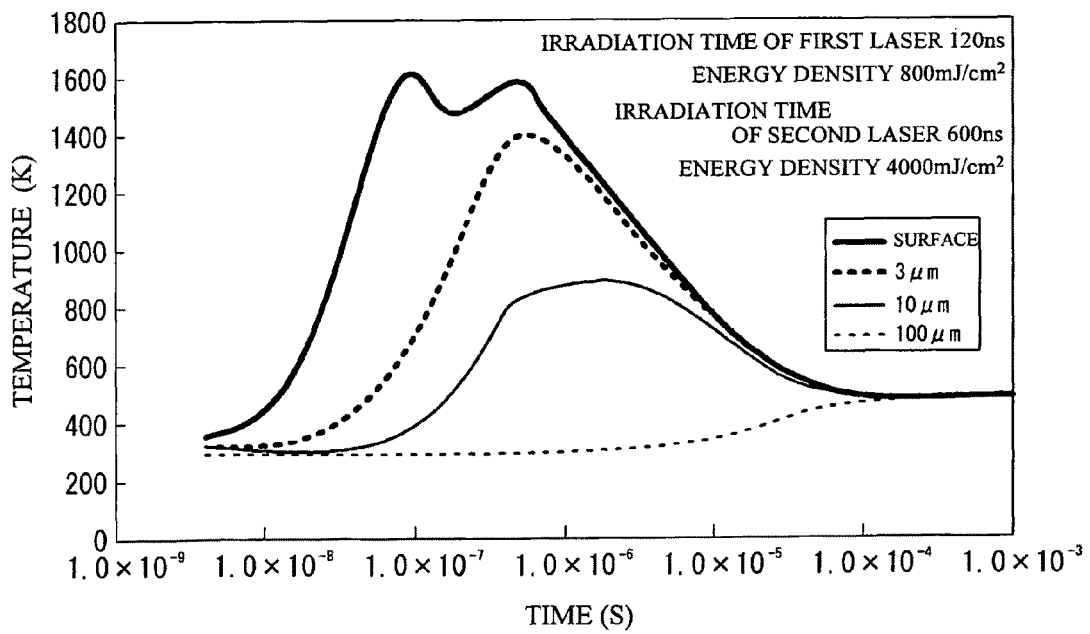

The temperatures at the regions to the depths of 3 μm and 10 μm may be increased by elongating the time for irradiating the second laser light 52. As the time for irradiating the second laser light 52 is made longer in the order of the cases shown in FIGS. 13(a), 13(b), 14(a), 14(b), 15(a), 15(b), 16(a) and 16(b), the highest temperature at the region to the depth of 3 µm changes to 740 K, 750 K, 820 K, 860 K, 930 K, 1100 K, 1280 K, and 1400 K, respectively. Referring to FIG. 13(b), in the case where the time for irradiating the first laser light 50 is substantially the same as that for irradiating the second laser light 52, the highest temperature at the region to the depth of 3 µm is 750 K, failing to reach the target temperature of 1273 K. Referring to FIG. 16(a), if the time for irradiating the second laser light is increased to 500 ns which is approximately four times longer than that for irradiating the first laser light, the highest temperature at the region to the depth of 3 µm becomes 1280 K higher than the target temperature of 1273 K.

Likewise the second embodiment, each time for irradiating the first and the second laser lights is controlled so as to control the temperature distribution of the substrate 60 in the depth direction.

In the process step for the thermal processing with the laser annealing system described referring to FIG. 4, at least one of the irradiation intensity and the irradiation time of the first and the second laser lights 50 and 52 is controlled to control the temperature distribution in the film of the substrate in the depth direction. The manufacturing method of the semiconductor device capable of heating the substrate or the film thereon to the desired depth to the desired temperature may be obtained. The use of the laser annealing system equipped with the control unit (first control circuit 54, second control circuit 56 and drive system control circuit 48) for controlling at least one of the irradiation intensity and the irradiation time of the first and the second laser lights 50 and 52 provides the manufacturing system of the semiconductor device capable of heating the substrate or the film thereon to the desired depth to the desired temperature.

As shown in the second embodiment to fourth embodiment, it is preferable to set the first penetration depth of the first laser light to approximately 1 µm for the thermal processing of the silicon substrate to the depth from several µms to several tens µm. Preferably, the laser light with the wavelength of approximately 500 nm is employed to use the second harmonic generation of the YLF laser or the $YVO_4$ laser other than the YAG laser. It is preferable to use the second laser light 52 with the penetration depth of approximately 20 µm to use the semiconductor laser, the $CO_2$ laser, or the like with the wavelength of approximately 800 nm.

Figure 17:
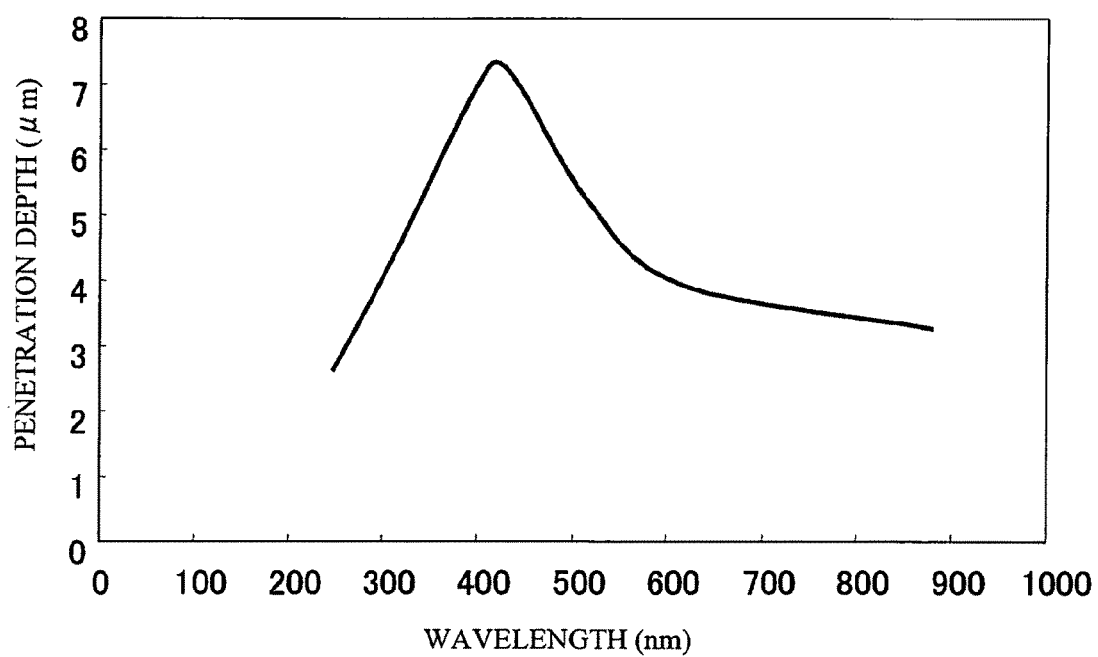
FIG. 17 is a view showing the wavelength dependence of the optical penetration depth to TiN.

The invention is applicable to the thermal processing not only to the silicon substrate but also to the silicon film. It is further applicable to the thermal processing of the material other than the silicon. FIG. 17 shows the optical penetration depth with respect to the optical wavelength to TiN, indicating the change in the penetration depth in accordance with the wavelength. The penetration depths in case of the wavelengths of 400 nm and 800 nm are 7 µm and 3 µm, respectively. The invention is applicable to the thermal processing of the TiN film formed on the substrate to obtain the effect of the invention by means of laser lights each with the wavelength of 400 nm and 800 nm, respectively. The invention is applicable to the thermal process of the film on the substrate, and further applicable to the substrate other than the silicon substrate and the film thereon.

Figure 18:
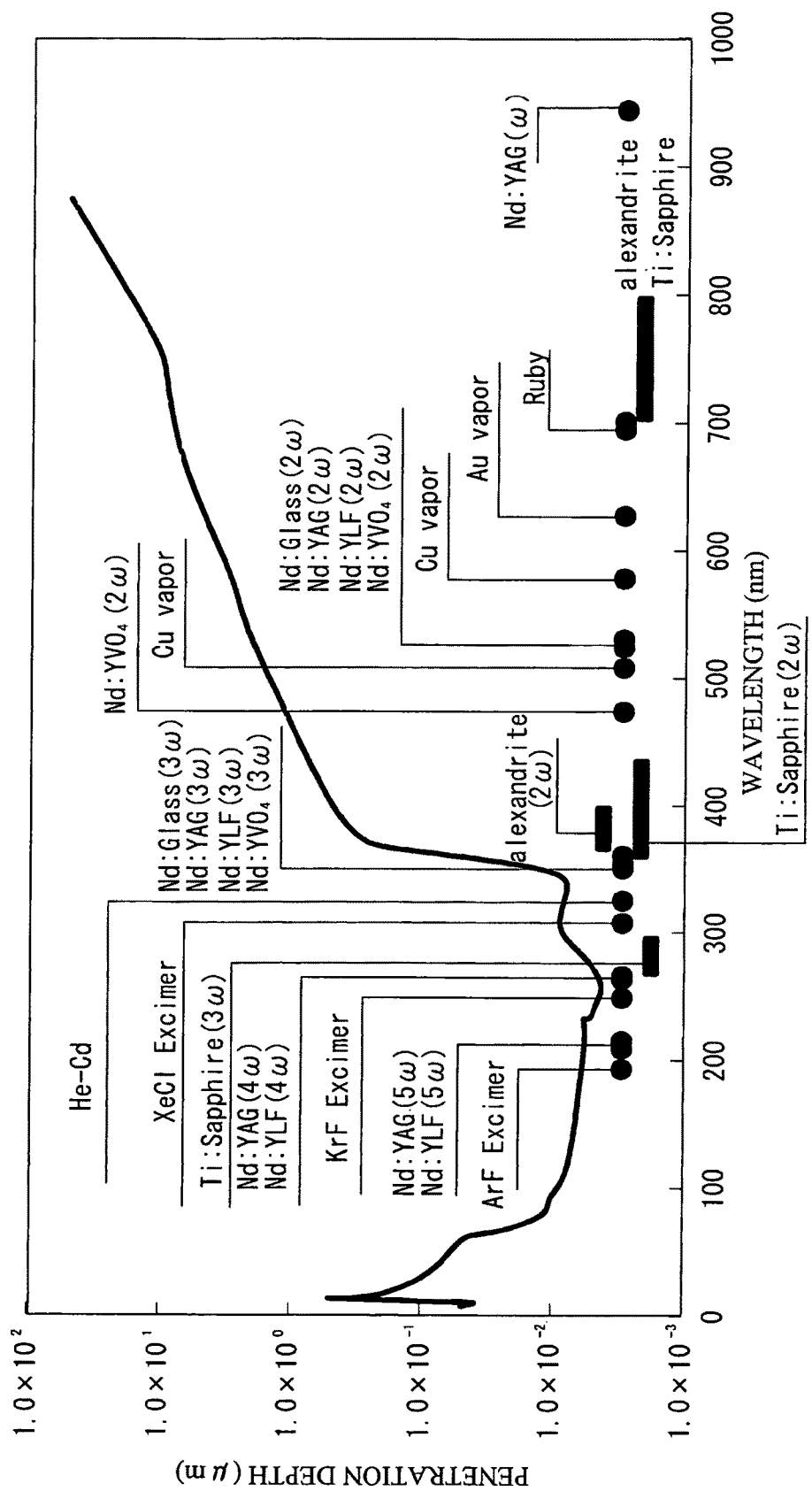
FIG. 18 is a view showing each wavelength of the laser lights and the penetration depth to the silicon with respect to the wavelength.

The other type of the laser may be used as the first and the second laser lights 50 and 52. FIG. 18 is a view showing each wavelength of the laser lights and the penetration depth to the silicon with respect to the wavelength. The first laser light 50 and the second laser light 52 may be formed as the one selected from the group including the excimer laser (XeCl Excimer, KrF Excimer and ArF Excimer), the fundamental wave of the YAG laser (not shown), the second harmonic (Nd: YAG ($2\omega$)), the third harmonic (Nd: YAG ($3\omega$)), the fourth harmonic (Nd: YAG ($4\omega$)), the fifth harmonic (Nd: YAG ($5\omega$)), $YVO_4$ laser fundamental wave (not shown), second harmonic (Nd: $YVO_4$ ($2\omega$)), third harmonic (Nd: $YVO_4$($3\omega$)), the fourth harmonic (Nd: $YVO_4$($4\omega$)), the fifth harmonic (Nd:$YVO_4$ ($5\omega$)), the fundamental wave of YLF laser (not shown), second harmonic (Nd: YLF ($2\omega$)), third harmonic Nd:YLF ($3\omega$), the fourth harmonic (Nd: YLF ($4\omega$)), fifth harmonic (Nd: YLF ($5\omega$)), the fundamental wave of glass laser (not shown), the second harmonic (Nd: Glass ($2\omega$)), third harmonic (Nd: Glass ($3\omega$)), fundamental waves of the ruby laser (Ruby), the alexandrite laser (Alexandrite), and the sapphire laser (Ti: Sapphire), the second harmonic (Ti: Sapphire ($2\omega$)), the third harmonic (Ti: Sapphire ($3\omega$)), the helium-cadmium laser (He—Cd), the copper vapor laser (Cu vapor), and the gold vapor laser (Au Vapor).

As has been described with respect to the embodiments of the invention, the invention is not limited to the embodiments as described above, and may be changed and modified without departing from the scope of the invention.

The invention claimed is:

1. A semiconductor device manufacturing method comprising simultaneously irradiating a first laser light and a second laser light with a wavelength different from that of the first laser light to a same surface of a semiconductor substrate to perform a thermal processing for activating ion implanted impurity in the semiconductor substrate so that an n-type or p-type diffusion region is formed in the semiconductor, substrate and a temperature of an entire area around the semiconductor substrate in a depth direction is lower than a melting point of the semiconductor substrate, an irradiation time of the first laser light and an irradiation time of the second laser light being controlled so that a temperature distribution in the semiconductor substrate in the depth direction is controlled, wherein:
   any one of the first laser light and the second laser light is continuous wave laser light, and the other of the first laser light and the second laser light is pulse laser light;
   the irradiation time of the any one of the first laser light and the second laser light is controlled by adjusting a moving speed and a beam spot size in a moving direction on the semiconductor substrate; and
   the irradiation time of the other of the first laser light and the second laser light is controlled based on a pulse width.

2. The semiconductor device manufacturing method according to claim 1, wherein:
   the semiconductor substrate is a silicon substrate, a wavelength of the first laser light is 370 nm or more, and a wavelength of the second laser light is more than that of the first laser light and is 900 nm or less.

3. The semiconductor device manufacturing method according to claim 2, wherein:
   the wavelength of the first laser light is 450 nm or more, and a wavelength of the second laser light is more than that of the first laser light and is 850 nm or less.

4. The semiconductor device manufacturing method according to claim 1, wherein each of the first laser light and the second laser light is irradiated from a laser selected from a group including an excimer laser, a CO2 laser, a YAG laser (fundamental wave or harmonic), a YVO4 laser (fundamental wave or harmonic), a YLF laser (fundamental wave or harmonic), YAlO3 laser (fundamental wave or harmonic), a glass laser (fundamental wave or harmonic), a ruby laser, an alexandrite laser (fundamental wave or harmonic), a Ti:sapphire laser (fundamental wave or harmonic), a helium-cadmium laser, a copper vapor laser, a gold vapor laser and a semiconductor laser.

5. The semiconductor device manufacturing method according to claim 1, further comprising forming an operation layer on a front surface of the semiconductor substrate, wherein in performing the thermal processing, the first laser light and the second laser light are irradiated to a back surface of the semiconductor substrate.

6. The semiconductor device manufacturing method according to claim 1, wherein:
the semiconductor substrate is a silicon substrate;
performing the thermal processing is activating an impurity implanted in the silicon substrate; and
a wavelength of the first laser light is 450 nm or more, and a wavelength of the second laser light is more than that of the first laser light and is 850 nm or less.

7. A semiconductor device manufacturing method comprising simultaneously irradiating a first laser light and a second laser light with a wavelength different from that of the first laser light to a same surface of a semiconductor substrate to perform a thermal processing for activating ion implanted impurity in the semiconductor substrate so that an n-type or p-type diffusion region is formed in the semiconductor substrate and a temperature of an entire area around the semiconductor substrate in a depth direction is lower than a melting point of the semiconductor substrate, an irradiation time of the first laser light and the second laser light being controlled so that a temperature distribution in the semiconductor substrate in the depth direction is controlled, wherein:
each of the first laser light and the second laser light is continuous wave laser light;
moving speeds of the first laser light and the second laser light to the semiconductor substrate are the same, and
the irradiation time is controlled by adjusting each of beam spot sizes of the first laser light and the second laser light in a moving direction.

8. A semiconductor device manufacturing system including a first laser for irradiating a first laser light, and a second laser for irradiating a second laser light with a wavelength different from that of the first laser light, in which the first laser light and the second laser light are simultaneously irradiated to a same surface of a semiconductor substrate to perform a thermal processing for activating ion implanted impurity in the semiconductor substrate so that an n-type or p-type diffusion region is formed in the semiconductor substrate and a temperature of an entire area around the semiconductor substrate in a depth direction is lower than a melting point of the semiconductor substrate, an irradiation time of the first laser light and the second laser light being controlled so that a temperature distribution in the semiconductor substrate in the depth direction is controlled, wherein:
any one of the first laser light and the second laser light is continuous wave laser light, and the other of the first laser light and the second laser light is pulse laser light;
the irradiation time of said any one of the first laser light and the second laser light is controlled by adjusting a moving speed and a beam spot size in a moving direction on the semiconductor substrate; and
the irradiation time of said the other of the first laser light and the second laser light is controlled based on a pulse width.

9. The semiconductor device manufacturing method according to claim 8, wherein:
the semiconductor substrate is a silicon substrate, a wavelength of the first laser light is 370 nm or more, and a wavelength of the second laser light is more than that of the first laser light and is 900 nm or less.

10. The semiconductor device manufacturing method according to claim 9, wherein:
the wavelength of the first laser light is 450 nm or more, and a wavelength of the second laser light is more than that of the first laser light and is 850 nm or less.

11. The semiconductor device manufacturing system according to claim 8, wherein each of the first laser light and the second laser light is irradiated from a laser selected from a group including an excimer laser, a CO2 laser, a YAG laser (fundamental wave or harmonic), a YVO4 laser (fundamental wave or harmonic), a YLF laser (fundamental wave or harmonic), YAlO3 laser (fundamental wave or harmonic), a glass laser (fundamental wave or harmonic), a ruby laser, an alexandrite laser (fundamental wave or harmonic), a Ti:sapphire laser (fundamental wave or harmonic), a helium-cadmium laser, a copper vapor laser, a gold vapor laser and a semiconductor laser.

12. The semiconductor device manufacturing system according to claim 8, wherein:
the semiconductor substrate is a silicon substrate;
performing the thermal processing is activating an impurity implanted in the silicon substrate; and
a wavelength of the first laser light is 450 nm or more, and a wavelength of the second laser light is more than that of the first laser light and is 850 nm or less.

13. A semiconductor device manufacturing system including a first laser for irradiating a first laser light, and a second laser for irradiating a second laser light with a wavelength different from that of the first laser light, in which the first laser light and the second laser light are simultaneously irradiated to a same surface of a semiconductor substrate to perform a thermal processing for activating ion implanted impurity in the semiconductor substrate so that an n-type or p-type diffusion region is formed in the semiconductor substrate and a temperature of an entire area around the semiconductor substrate in a depth direction is lower than a melting point of the semiconductor substrate, an irradiation time of the first laser light and the second laser light being controlled so that a temperature distribution in the semiconductor substrate in the depth direction is controlled, wherein:
each of the first laser light and the second laser light is continuous wave laser light;
moving speeds of the first laser light and the second laser light to the semiconductor substrate are the same, and
the irradiation time is controlled by adjusting each of beam spot sizes of the first laser light and the second laser light in a moving direction.

* * * * *